(12) United States Patent
Huang et al.

(10) Patent No.: US 12,120,893 B2
(45) Date of Patent: Oct. 15, 2024

(54) INTERCONNECTION STRUCTURES FOR PEROVSKITE TANDEM SOLAR CELLS

(71) Applicant: The University of North Carolina at Chapel Hill, Chapel Hill, NC (US)

(72) Inventors: Jinsong Huang, Chapel Hill, NC (US); Zhenhua Yu, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 0 days.

(21) Appl. No.: 17/057,460

(22) PCT Filed: May 24, 2019

(86) PCT No.: PCT/US2019/034066
§ 371 (c)(1),
(2) Date: Nov. 20, 2020

(87) PCT Pub. No.: WO2019/227083
PCT Pub. Date: Nov. 28, 2019

(65) Prior Publication Data
US 2021/0143351 A1    May 13, 2021

Related U.S. Application Data

(60) Provisional application No. 62/676,343, filed on May 25, 2018.

(51) Int. Cl.
*H01L 31/00*     (2006.01)
*H10K 30/15*     (2023.01)
(Continued)

(52) U.S. Cl.
CPC ......... *H10K 30/152* (2023.02); *H10K 30/151* (2023.02); *H10K 30/81* (2023.02); *H10K 85/215* (2023.02)

(58) Field of Classification Search
CPC ............. H01L 51/4233; H01L 51/0047; H01L 51/4226; H01L 51/441; H01L 51/0036;
(Continued)

(56) References Cited

U.S. PATENT DOCUMENTS

2011/0100431 A1    5/2011   Horng et al.
2014/0026948 A1    1/2014   Ihn et al.
(Continued)

FOREIGN PATENT DOCUMENTS

KR    10-2018-0018592       2/2018
WO    WO 2016-19198889 A1   12/2016

OTHER PUBLICATIONS

Bai ("Enhancing stability and efficiency of perovskite solar cells with crosslinkable silane-functionalized and doped fullerene", Nature Communications vol. 7, Article No. 12806 (2016) (Year: 2016).*
(Continued)

*Primary Examiner* — Angelo Trivisonno
(74) *Attorney, Agent, or Firm* — Alston & Bird LLP

(57) ABSTRACT

The present disclosure is directed to double junction tandem perovskite solar cells having a n+/n interconnection layer comprising an ion-doped fullerene layer and a metal oxide layer. In certain embodiments, the metal oxide is $SnO_{2-x}$ ($0<x<1$). The ion-doped fullerene and metal oxide layers form Ohmic contacts with the wide bandgap and narrow bandgap perovskite sub cells and demonstrate low resistivity and high power conversion efficiencies.

24 Claims, 12 Drawing Sheets

(51) Int. Cl.
*H10K 30/81* (2023.01)
*H10K 85/20* (2023.01)

(58) Field of Classification Search
CPC .............. H01L 51/0037; H01L 51/0046; H01L 51/4213; H01L 51/4246; Y02E 10/549
See application file for complete search history.

(56) References Cited

U.S. PATENT DOCUMENTS

| | | |
|---|---|---|
| 2017/0005284 A1 | 1/2017 | Che et al. |
| 2017/0133163 A1 | 5/2017 | Russell et al. |
| 2017/0271622 A1* | 9/2017 | Chaudhari ........ H01L 29/78678 |

OTHER PUBLICATIONS

Eperon ("Perovskite-perovskite tandem photovoltaics with optimized bandgaps"), Science • Oct. 20, 2016 • vol. 354, Issue 6314 • pp. 861-865 • DOI: 10.1126/science.aaf9717 (Year: 2016).*
Ebrahimiasl ("Synthesis of Nanocrystalline SnOx (x=1-2) Thin Film Using a Chemical Bath Deposition Method with Improved Deposition Time, Temperature and pH") Sensors 2011, 11, 9207-9216; doi:10.3390/s111009207 (Year: 2011).*
Um ("Homo-Junction pn Diode Using p-Type SnO and n-Type SnO2 Thin Films") ECS Solid State Letters, 3 (8) p. 94-p. 98 (2014) (Year: 2014).*
Zhou ("Band gap engineering of bulk and nanosheet SnO: an insight into the interlayer Sn—Sn lone pair interactions") Phys.Chem.Chem. Phys., 2015, 17, 17816 (Year: 2015).*
Becker ("All-Oxide MoOx/SnOx Charge Recombination Interconnects for Inverted Organic Tandem Solar Cells"), Advanced Energy Materials, 8(10), Article 1702533. https://doi.org/10.1002/aenm. 201702533. Published: May 4, 2018 (Year: 2018).*
Bai, Yang et al., "Enhancing stability and efficiency of perovskite solar cells with crosslinkable silane-functionalized and doped fullerene," Nature Communications, 7:12806, 9 pgs., (Oct. 5, 2016).
Boyali, E. et al., "Temperature dependent electron transport properties of degenerate SnO2 thin films," Journal of Alloys and Compounds, 692:119-123, (2017).
Bush, Kevin A. et al., "23.6%-Efficient Monolithic Perovskite/Silicon Tandem Solar Cells with Improved Stability," Nature Energy, 28 pgs. (Feb. 2017).
Dong, Qingshun et al., "Insight into Perovskite Solar Cells Based on SnO2 Compact Electron-Selective Layer," The Journal Physical Chemistry, 119:10212-10217, (2015).
Eperon, Giles E. et al., "Perovskite-perovskite tandem photovoltaics with optimized bandgaps," Science, 354, 9 pgs., (2016).
Hadipour, Afshin et al., "Solution-Processed Organic Tandem Solar Cells," Advanced Functional Materials, 16:1897-1903 (2006).
Heo, Jin Hyuck et al., "CH3NH3PbBr3-CH3NH3PbI3 Perovskite-Perovskite Tandem Solar Cells with Exceeding 2.2 V Open Circuit Voltage," Advanced Materials 28:5121-5125 (2016).
Jang, Yoon Hee et al., "Monolithic tandem solar cells comprising electrodeposited CuInSe2 and perovskite solar cells with a nanoparticulate ZnO buffer layer," Journal of Materials Chemistry A, 5:19439-19446, (2017).
Jarzebski, Z.M. et al., "Physical Properties of SnO2 Materials," Journal of Electrochemical Society, 123:299C-310C, (Sep. 1976).
Jiang, Fangyuan et al., "A two-terminal perovskite/perovskite tandem solar cell," Journal of Materials Chemistry A, 4:1208-1213, (2016).
Jiang, Qi et al., "Enhanced electron extraction using SnO2 for high-efficiency planar-structure HC(NH2)2PbI3-based perovskite solar cells," Nature Energy, 2(16177):1-7, (Nov. 14, 2016).
Kavan, Ladislav et al., "Ultrathin Buffer Layers of SnO2 by Atomic Layer Deposition: Perfect Blocking Function and Thermal Stability," The Journal of Physical Chemistry C, 121:342-350, (2017).

Li, Chang-Zhi et al., "Doping of Fullerenes via Anion-Induced Electron Transfer and Its Implication for Surfactant Facilitated High Performance Polymer Solar Cells," Advanced Materials, 25:4425-4430, (2013).
Li, Yunlong et al., "50% Sn-Based Planar Perovskite Solar Cell with Power Conversion Efficiency up to 13.6%," Advanced Energy Materials, 6:1601353, 7 pgs., (2016).
Lin, Yuze et al., "Matching Charge Extraction Contact for Wide-Bandgap Perovskite Solar Cells," Advanced Materials, 29:1700607, 8 pgs., (2017).
Liu, Yao et al., "High Efficiency Tandem Thin-Perovskite/Polymer Solar Cells with a Graded Recombination Layer," ACS Applied Materials & Interfaces, 8:7070-7076, (2016).
Loch, L.D., "The Semiconducting Nature of Stannic Oxide," Journal of the Electrochemical Society, 110(10):1081-1083, (Oct. 1963).
Matsushima, Yuta et al., "Thermogravimetric investigation of oxygen deficiency in SnO2 reduced at 500° C. or below," Solid State Ionics, 308:101-106, (2017).
Prasanna, Rohit et al., "Band Gap Tuning via Lattice Contraction and Octahedral Tilting in Perovskite Materials for Photovoltaics," 23 pgs. (2017).
Rajagopal, Adharsh et al., "Highly Efficient Perovskite-Perovskite Tandem Solar Cells Reaching 80% of the Theoretical Limit in Photovoltage," Advanced Materials, 1702140, 10 pgs., (Jul. 2017).
Saliba, Michael et al., "Cesium-containing triple cation perovskite solar cells: improved stability, reproducibility and high efficiency," Energy and Environmental Science, 9(6):1989-1997, (Jun. 2016).
Samson, S. et al., "Defect structure and electronic donor levels in stannic oxide crystals," Journal of Applied Physics, 44(10):4618-4621, (Oct. 1973).
Shao, Yuchuan et al., "Origin and elimination of photocurrent hysteresis by fullerene passivation in CH3NH3PbI3 planar heterojunction solar cells," Nature Communications, 5:5784, 7 pgs., (2014).
Sun, X. et al., "Halide anion-fullerene TT nonconvalent interactions: n-doping and a halide anion migration mechanism in p—i—n perovskite solar cells," Journal of Materials Chemistry A, 5:20720-20728, (2017).
Wang, Qi, "Qualifying composition dependent p and n self-doping in CH3NH3PbI3," Applied Physics Letters, 105(163508):1-5, (2014).
Wojciechowski, Konrad et al., "C60 as an Efficient n-Type Compact Layer in Perovskite Solar Cells," The Journal of Physical Chemistry Letters, 6:2399-2405, (2015).
Xu, Jixian et al., "Perovskite-fullerene hybrid materials suppress hysteresis in planar diodes," Nature Communications, 6:7081, 8 pgs., (2015).
Yakimov, A. et al., "High photovoltage multiple-heterojunction organic solar cells incorporating interfacial metallic nanoclusters," Applied Physics Letters, 80(9):1667-1669, (Mar. 4, 2002).
Yang, Guang et al., "Effective Carrier-Concentration Tuning of SnO2 Quantum Dot Electron-Selective Layers for High-Performance Planar Perovskite Solar Cells," Advanced Materials, 1706023, 9 pgs., (Feb. 2018).
Yang, Woon Seok et al., "Iodide management in formamidinium-lead-halide-based perovskite layers for efficient solar cells," Science, 356:1376-1379, (Jun. 23, 2017).
Yang, Zhibin et al., "Stable Low-Bandgap Pb—Sn Binary Perovskites for Tandem Solar Cells," Advanced Materials, 8 pgs., (2016).
Yoon, Heetae et al., "Hysteresis-free low-temperature-processed planar perovskite solar cells with 19.1% efficiency," Energy and Environmental Science, 9:2262-2266, (2016).
Zhao, Dewei et al., "Low-bandgap mixed tin-lead iodide perovskite absorbers with long carrier lifetimes for all-perovskite tandem solar cells," Nature Energy, 2(17018):1-7, (Mar. 1, 2017).
Zhou, Yinhua et al., "High performance polymeric charge recombination layer for organic tandem solar cells," Energy and Environmental Science, 5:9827-9832, (2012).
WIPO Application No. PCT/US2019/034066, PCT International Search Report and Written Opinion of the International Searching Authority mailed Sep. 19, 2019.

\* cited by examiner

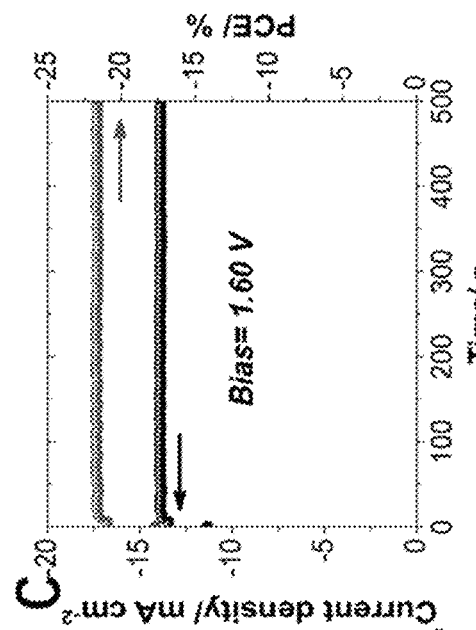
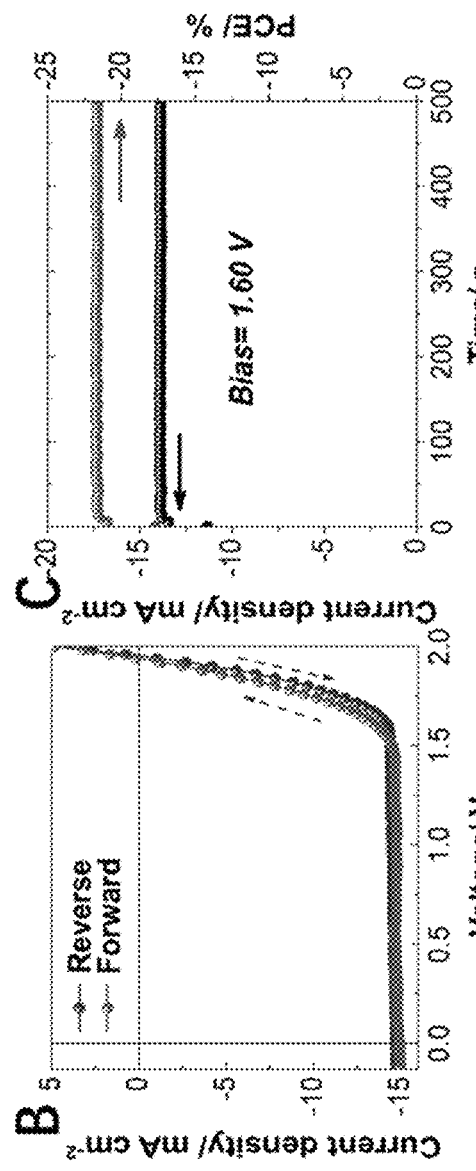
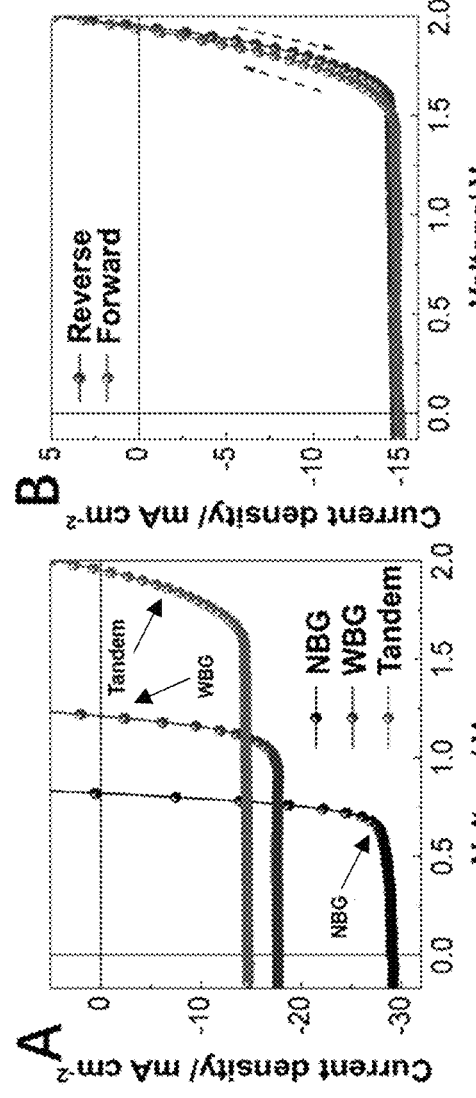
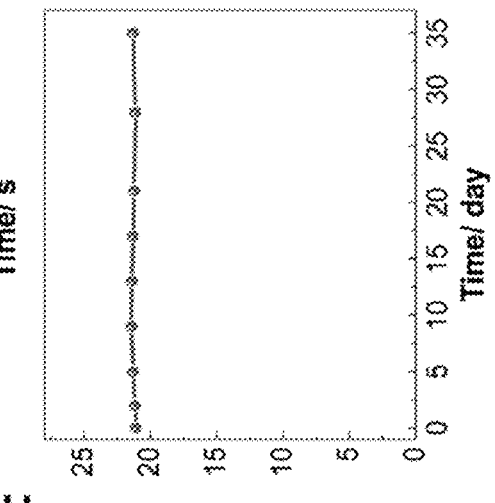
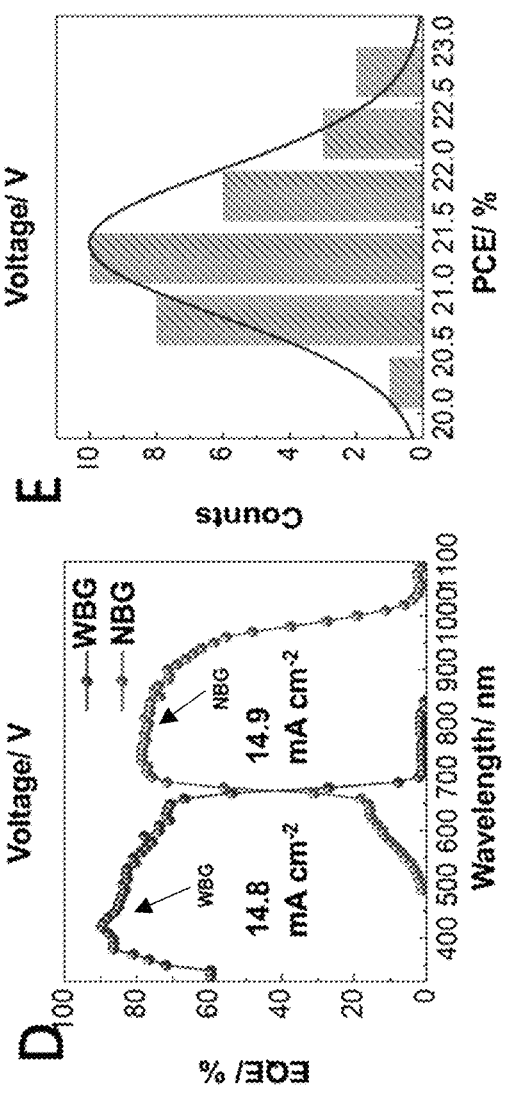
Fig. 5A  Fig. 5B  Fig. 5C  Fig. 5D  Fig. 5E  Fig. 5F

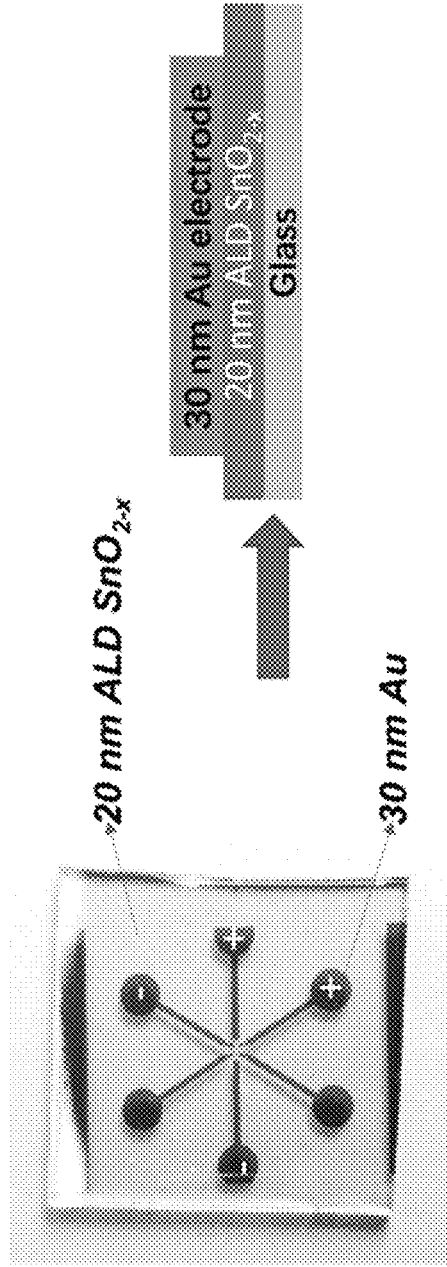
Fig. 6A
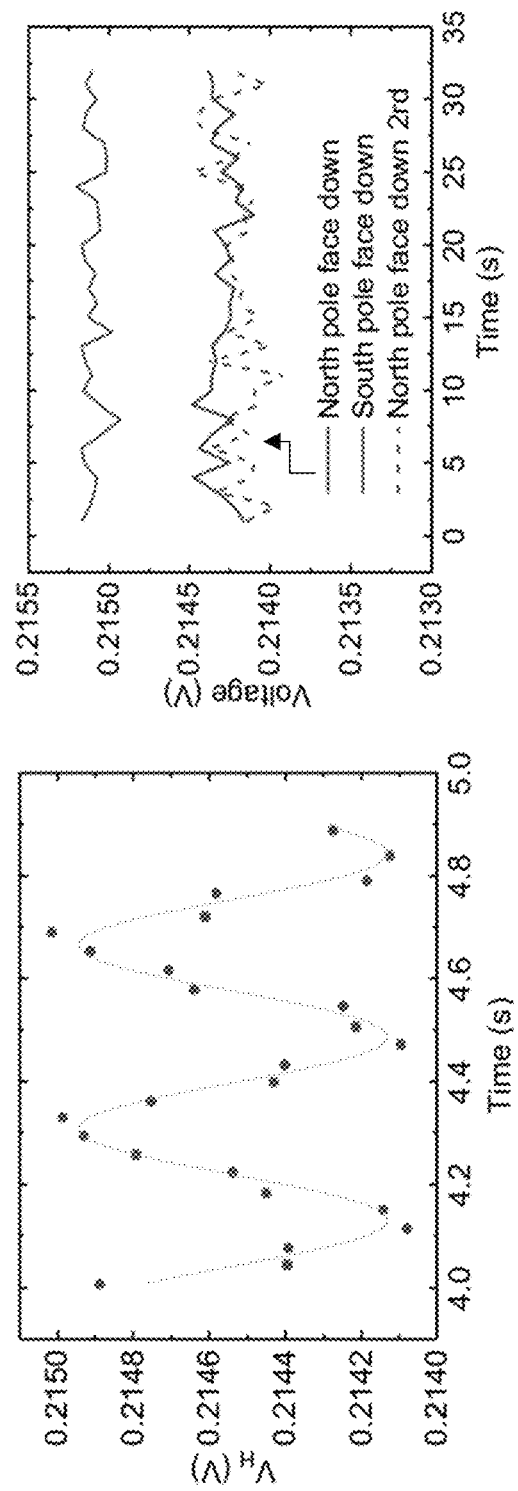
Fig. 6B
Fig. 6C

INTERCONNECTION STRUCTURES FOR PEROVSKITE TANDEM SOLAR CELLS

CROSS-REFERENCE TO RELATED APPLICATIONS

This application is a U.S. National Stage entry of International Application No. PCT/US2019/034066, filed May 24, 2019, which claims the benefit of priority to U.S. Provisional Application No. 62/676,343, filed May 25, 2018, which areis herein incorporated by reference in their entirety for all purposes.

GOVERNMENT INTEREST

This invention was made with government support under Grant Numbers DE-EE0006709, DE-EE0008749 awarded by the Department of Energy. The government has certain rights in the invention.

FIELD

The presently disclosed subject matter relates generally to double junction tandem perovskite solar cells with an interconnection layer comprising an ion-doped fullerene layer and a metal oxide layer.

BACKGROUND

It is predicted that most single-junction solar cells will encounter the bottleneck of their development when their power conversion efficiencies (PCEs) approach the Shockley-Queisser limit. Traditionally, higher PCEs have been achieved by constructing tandem solar cell structures, which can both broaden the absorption spectrum and reduce thermalization loss. Commercial tandem solar cells based on III-V semiconductors are typically fabricated by epitaxial growth on wafers, the processes for which can be complicated and costly.

The development of efficient tunnel junctions in tandem solar cells has been a particular matter of concern. Generally, tunnel junctions, such as p/n junctions, have been applied between two sub-cells to avoid the formation of a reverse p-n junction in the middle. However, many of the processes used to prepare tunneling junction are expensive and slow. Another method of forming ohmic contact between two sub cells involves inserting a semitransparent, conductive recombination layer, such as Indium tin oxide (ITO). The addition of the conductive recombination layer resembles the stacking of two sub cells that share a common transparent electrode. However, one issue typically encountered with these materials is that the generated UV rays or X-rays during magnetic sputtering damages the photovoltaic materials in the structure. Additionally, the transparency deceases at longer wavelengths as a result of free carrier absorption. As such, what is needed in the art is an efficient tandem cell structure that can be constructed from low-cost materials. The subject matter disclosed herein addresses this problem.

BRIEF SUMMARY

In one aspect, the subject matter described herein is directed to a double junction tandem perovskite solar cell comprising:
a transparent conductive substrate;
a hole transport layer disposed on said conductive substrate;
a wide bandgap perovskite layer disposed on said hole transport layer;
an X layer disposed on said wide bandgap perovskite layer;
an ion-doped fullerene layer disposed on said X layer;
a metal oxide layer disposed on said ion-doped fullerene layer, wherein said metal oxide layer is a metal oxide selected from the group consisting of $SnO_{2-x}$ ($0<x<1$), $Al_2O_{3-x}$ ($0<x<3$), $TiO_{2-x}$ ($0<x<1$), $ZnO_{1-x}$ ($0<x<1$), $Ga_2O_{3-x}$ ($0<x<3$), $V_2O_{5-x}$ ($0<x<5$), and $MoO_{3-x}$ ($0<x<3$);
a Y layer disposed on said metal oxide layer;
a narrow bandgap perovskite layer disposed on said Y layer;
an electron transport layer disposed on said narrow bandgap perovskite layer; and
an electrode disposed on said electron transport layer, wherein
said Y layer does not comprise a conductive transparent oxide material;
said X layer is absent or present, and when absent, said ion-doped fullerene layer is disposed on said wide bandgap perovskite layer; and
said Y layer is absent or present, and when absent, said narrow bandgap perovskite layer is disposed on said metal oxide layer.

In another aspect, the subject matter described herein is directed to a double junction tandem perovskite solar cell comprising:
a conductive substrate;
an electron transport layer disposed on said conductive substrate;
a wide bandgap perovskite layer disposed on said electron transport layer;
a Y layer disposed on said wide bandgap perovskite layer;
a metal oxide layer disposed on said Y layer, wherein said metal oxide layer is a metal oxide selected from the group consisting of $SnO_{2-x}$ ($0<x<1$), $Al_2O_{3-x}$ ($0<x<3$), $TiO_{2-x}$ ($0<x<1$), $ZnO_{1-x}$ ($0<x<1$), $Ga_2O_3$ ($0<x<3$), $V_2O_{5-x}$ ($0<x<5$), and $MoO_{3-x}$ ($0<x<3$);
an ion-doped fullerene layer disposed on said metal oxide layer;
an X layer disposed on said ion-doped fullerene layer;
a narrow bandgap perovskite layer disposed on said X layer;
a hole transport layer disposed on said narrow bandgap perovskite layer; and
an electrode disposed on said hole transport layer, wherein
said Y layer does not comprise a conductive transparent oxide material;
said X layer is absent or present, and when absent, said narrow bandgap perovskite layer is disposed on said ion-doped fullerene layer; and
said Y layer is absent or present, and when absent, said metal oxide layer is disposed on said wide bandgap perovskite layer.

These and other aspects are described fully herein.

BRIEF DESCRIPTION OF THE DRAWINGS

FIG. 5A shows J-V curves of single-junction NBG (1.23 eV) and WBG perovskite (1.78 eV) cells and tandem cells based on $C_{60}/SnO_{2-x}$ interconnection structure.

FIG. 5B shows J-V curves for tandem device based on $C_{60}/SnO_{2-x}$ interconnection layers under both forward and reverse scan modes.

FIG. 5C shows the steady state photocurrent density output of a tandem device based on $C_{60}/SnO_{2-x}$ interconnection layers at maximum power point with a bias of 1.60 V.

FIG. 5D shows EQE spectra of both sub cells in the monolithic perovskite-perovskite tandem device based on the $C_{60}/SnO_{2-x}$ interconnection structure.

FIG. 5E shows tandem device performance statistics from 40 samples, where the solid line represents the Gauss distribution fitting for the statistics.

FIG. 5F shows the efficiency evolution of the encapsulated tandem devices stored in the air and in the dark.

FIG. 6A shows a photo and the structure of the device used for Hall effect measurements.

FIG. 6B shows the measured Hall voltage signal while rotating the magnetic field for ALD deposited $SnO_{2-x}$.

FIG. 6C shows the measured voltage output while fixing the magnetic field with different directions for ALD deposited $SnO_{2-x}$.

DETAILED DESCRIPTION

Figures 1A, 1B:
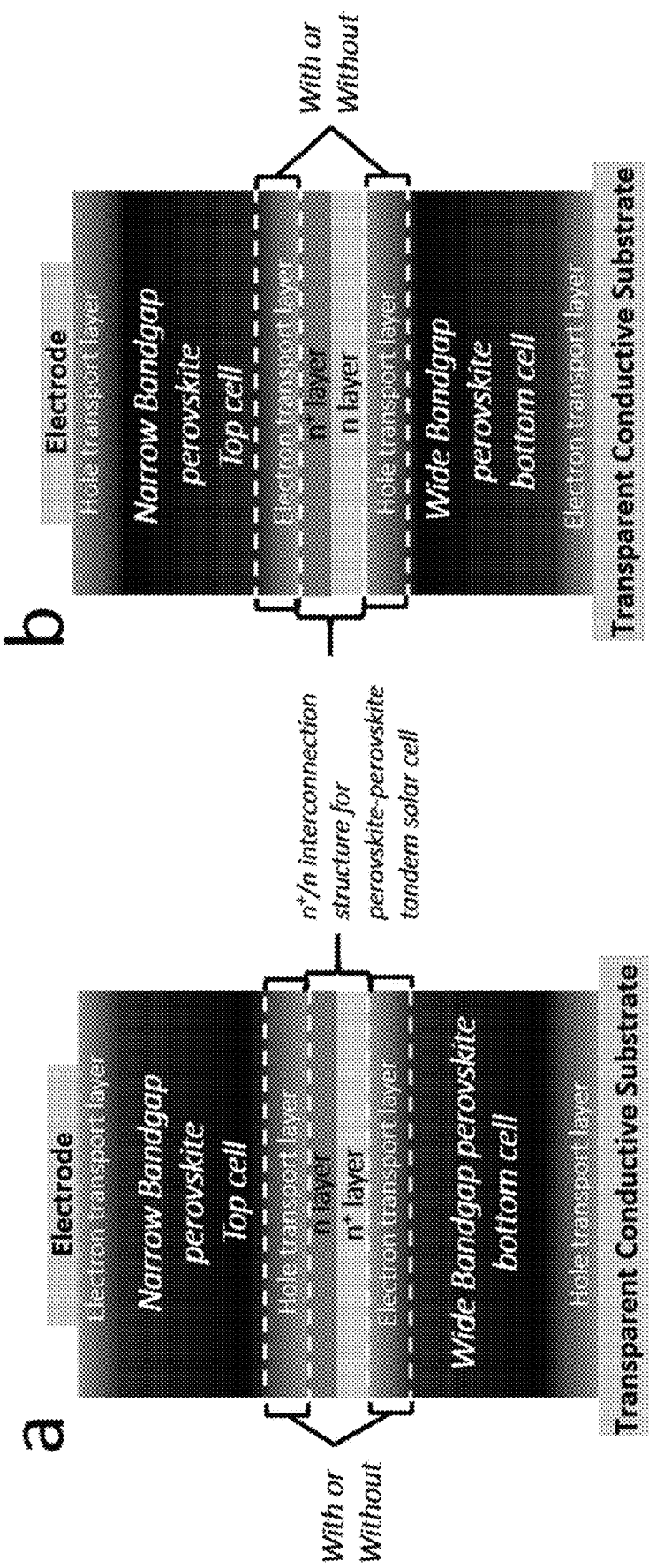
FIG. 1A shows a structure of a double junction tandem solar cell based on the n+/n connect unit with p-i-n type sub-cells.
FIG. 1B shows a structure of a double junction tandem solar cell based on the n+/n connect unit with n-i-p type sub-cells.

The subject matter described herein relates to n$^+$/n type interconnection structures in efficient perovskite-perovskite tandem cells (FIG. 1A and FIG. 1B). The interconnection structure comprises a doped fullerene layer and a metal oxide layer. As disclosed herein, the doped fullerene and metal oxide layers form Ohmic contacts with wide bandgap and narrow bandgap perovskite sub cells and demonstrate low resistivity. Additionally, the tandem cell device employs organic-inorganic metal halide perovskites of the formula ABX$_3$, which combine the advantages of tunable bandgap, low open open-circuit voltage (V$_{OC}$) loss, solution processability, and low-cost.

The interconnection layers in solution-processed monolithic organic and inorganic tandem solar cells generally have a structure of electron transport layer (ETL)/charge recombination layer/hole transport layer (HTL). The charge recombination structure may be a heavily doped poly(3,4-ethylenedioxythiophene):poly(styrene-sulfonate) (PEDOT:PSS), a p$^+$/n$^+$ tunneling junction, a very thin (typically non-continuous metal) layer, or a conductive transparent oxide, such as indium tin oxide (ITO) (1-7). One of the first monolithic perovskite-perovskite tandem solar cells was reported by G. E. Eperon et al., which had interconnection layers of fullerene/$SnO_{2-x}$ (0<x<1)/ITO/PEDOT:PSS (8). This ITO-derived interconnection structure demonstrated an initial power conversion efficiency (PCE) of 17.0% using two perovskite sub-cells with bandgaps of 1.20 eV and 1.80 eV, respectively. While perovskite monolithic tandem solar cells have demonstrated a greater PCE of 19.3% (*Materials Research Society*, Spring 2018 Conference) with improved sub cell efficiencies, these values are still lower than single-junction perovskite solar cells, which have exhibited efficiencies of up to 22.7% (12). Limitations for PCE enhancement of perovskite-perovskite tandem device structures with such ITO-based interconnection layers are the smaller open circuit voltage ($V_{OC}$) than the summed $V_{OC}$ of the two sub-cells, loss of short circuit current density ($J_{SC}$) due to the parasitic absorption of ITO, and the damage of functional layers by the sputtering of ITO, which also reduces the device fill factors (FF).

The interconnection structures disclosed herein require fewer layers than those disclosed in the art and achieve PCEs in perovskite-perovskite monolithic tandem solar cells of about 22.9%. The interconnection layers have a structure of ion-doped fullerene/metal oxide. In certain embodiments, the metal oxide is $SnO_{2-x}$ (0<x<1). With the ability to tune the wide and narrow band gap perovskite layers, the absorption of the tandem cells covers a wide spectrum range from 300 to 1020 nm. Furthermore, the $SnO_{2-x}$ layer, grown by low temperature atomic layer deposition, effectively protects the underlying, first perovskite sub cell from the damage caused by the subsequent spin-coating of the second perovskite cell and additional layers. The protection enabled by the condensed, compact $SnO_{2-x}$ layer allows for the removal of the ITO layer from the interconnection layers, which had previously served as both a protecting and charge recombination layer in tandem solar cells. Compared to the interconnection layer of $C_{60}$/$SnO_{2-x}$/ITO/PEDOT:PSS, the $C_{60}$/$SnO_{2-x}$ structure is simpler by omitting two layers, which not only makes fabrication faster and more economical, but also enhances the device efficiency by avoiding the parasitic absorption from the ITO and PEDOT:PSS, as well as potential damage caused by the deposition of the ITO and PEDOT:PSS layers.

The presently disclosed subject matter will now be described more fully hereinafter. However, many modifications and other embodiments of the presently disclosed subject matter set forth herein will come to mind to one skilled in the art to which the presently disclosed subject matter pertains having the benefit of the teachings presented in the foregoing descriptions. Therefore, it is to be understood that the presently disclosed subject matter is not to be limited to the specific embodiments disclosed and that modifications and other embodiments are intended to be included within the scope of the appended claims. In other words, the subject matter described herein covers all alternatives, modifications, and equivalents. Unless otherwise defined, all technical and scientific terms used herein have the same meaning as commonly understood by one of ordinary skill in this field. All publications, patent applications, patents, and other references mentioned herein are incorporated by reference in their entirety. In the event that one or more of the incorporated literature, patents, and similar materials differs from or contradicts this application, including but not limited to defined terms, term usage, described techniques, or the like, this application controls.

I. Definitions

As used herein, "and/or" refers to and encompasses any and all possible combinations of one or more of the associated listed items, as well as the lack of combinations when interpreted in the alternative ("or").

As used herein, the term "about," when referring to a measurable value such as an amount of a compound or agent of the current subject matter, dose, time, temperature, and the like, is meant to encompass variations of ±20%, ±10%, ±5%, ±1%, ±0.5%, or even ±0.1% of the specified amount.

The terms "approximately," "about," "essentially," and "substantially" as used herein represent an amount close to the stated amount that still performs a desired function or achieves a desired result. For example, in some embodiments, as the context may dictate, the terms "approximately", "about", and "substantially" may refer to an amount that is within less than or equal to 10% of the stated amount. The term "generally" as used herein represents a value, amount, or characteristic that predominantly includes or tends toward a particular value, amount, or characteristic.

As used herein, conditional language used herein, such as, among others, "can," "could," "might," "may," "e.g.," and the like, unless specifically stated otherwise or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

As used herein, "n-type" refers to a structure, layer, or material wherein electrons are the majority carriers and holes are the minority carriers.

As used herein, "p-type" refers to a structure, layer, or material wherein holes are the majority carriers and electrons are the minority carriers.

As used herein "doped," refers to a structure, layer, or material that is doped with a doping agent. A layer may be doped with an n-type dopant (also "n-doped" herein) or a p-type dopant (also "p-doped" herein).

As used herein, "dopant," refers to a doping agent, such as an n-type dopant or a p-type dopant.

As understood to those of ordinary skill in the semiconductor art, the "level" of dopant describes the concentration of the dopant impurity in the semiconductor. For example, as used herein, "lightly doped" indicates that the level of doping is about $10^{14}$ to about $10^{16}$ dopant atoms/$cm^3$, "medium doped" indicates that the level of doping is about $10^{17}$ dopant atoms/$cm^3$, and "heavily doped" indicates that the level of doping is about $10^{18}$ to about $10^{20}$ dopant atoms/$cm^3$. Accordingly, as used herein, the notation "p" or "n" indicates that a corresponding semiconductor is lightly or medium doped p-type or n-type, respectively, and "doped "$p^+$" or "$n^+$" indicates that a corresponding semiconductor is heavily doped p-type or n-type, respectively.

As used herein, "ion-doped" refers to a material or compound that is doped with a dopant, wherein the dopant is an ion. For example, fullerene that is doped with an ion would be referred to as "ion-doped fullerene."

As used herein, "interconnection structure" refers to the material layers that connect the first sub cell with the second sub cell in a tandem solar cell. The material layers in the interconnection structure help function as charge extraction and recombination layers.

As used herein, "n/n⁺ interconnection layer" or "n⁺/n interconnection layer" refers to an interconnection layer that comprises one layer of n-type material stacked on top of or below a n⁺-type material. In certain embodiments, the n/n⁺ or n⁺/n interconnection layer consists essentially of one layer of n-type material stacked on top of or below a n⁺-type material.

As used herein, "HTL" refers to hole transport layer.

As used herein, "ETL" refers to electron transport layer.

As used herein, "bipolar transport properties" refers to a material with the ability to transport both electrons and holes. In certain embodiments, a material that exhibits bipolar transport properties can act as both an electron transport material and as a hole transport material.

As used herein, "ALD" refers to atomic layer deposition. As used herein, "LT-ALD" refers to low temperature atomic layer deposition.

As used herein, "substrate," refers to any workpiece on which film or thin film formation is desired. A substrate includes, without limitation, silicon, silica, sapphire, zinc oxide, carbon (e.g., graphene), SiC, AN, GaN, spinel, coated silicon, silicon on oxide, silicon carbide on oxide, glass, gallium nitride, indium nitride, titanium dioxide, aluminum nitride, a metallic material (e.g., molybdenum, tungsten, copper, aluminum), and combinations (or alloys) thereof.

As used herein, "NBG" refers to narrow band gap.

As used herein, "WBG" refers to wide band gap.

As used herein, "alloy" refers to a homogeneous mixture or solid solution of two or more metals or metal oxides. In certain embodiments, an alloy is $SnO_{2-x}$, comprising $SnO_2$ and SnO.

II. Solar Cell Structures

The subject matter described herein is directed to double junction tandem perovskite solar cells. In certain embodiments, the solar cell is a p-i-n type solar cell. In certain embodiments, the p-i-n type solar cell is a double junction tandem perovskite solar comprising:
a conductive substrate;
a hole transport layer disposed on said conductive substrate;
a wide bandgap perovskite layer disposed on said hole transport layer;
an X layer disposed on said wide bandgap perovskite layer;
an ion-doped fullerene layer disposed on said X layer;
a metal oxide layer disposed on said ion-doped fullerene layer, wherein said metal oxide layer is a metal oxide selected from the group consisting of $SnO_{2-x}$ (0<x<1), $Al_2O_{3-x}$ (0<x<3), $TiO_{2-x}$ (0<x<1), $ZnO_{1-x}$ (0<x<1), $Ga_2O_{3-x}$ (0<x<3), $V_2O_{5-x}$ (0<x<5), and $MoO_{3-x}$ (0<x<3);
a Y layer disposed on said metal oxide layer;
a narrow bandgap perovskite layer disposed on said Y layer;
an electron transport layer disposed on said narrow bandgap perovskite layer; and
an electrode disposed on said electron transport layer, wherein
said Y layer does not comprise a conductive transparent oxide material;
said X layer is absent or present, and when absent, said ion-doped fullerene layer is disposed on said wide bandgap perovskite layer; and
said Y layer is absent or present, and when absent, said narrow bandgap perovskite layer is disposed on said metal oxide layer.

In certain embodiments, the solar cell is a n-i-p type solar cell. In certain embodiments, the n-i-p type solar cell is a double junction tandem perovskite solar cell comprising:
a conductive substrate;
an electron transport layer disposed on said conductive substrate;
a wide bandgap perovskite layer disposed on said electron transport layer;
a Y layer disposed on said wide bandgap perovskite layer;
a metal oxide layer disposed on said Y layer, wherein said metal oxide layer is a metal oxide selected from the group consisting of $SnO_{2-x}$ (0<x<1), $Al_2O_{3-x}$ (0<x<3), $TiO_{2-x}$ (0<x<1), $ZnO_{1-x}$ (0<x<1), $Ga_2O_{3-x}$ (0<x<3), $V_2O_{5-x}$ (0<x<5), and $MoO_{3-x}$ (0<x<3);
an ion-doped fullerene layer disposed on said metal oxide layer;
an X layer disposed on said ion-doped fullerene layer;
a narrow bandgap perovskite layer disposed on said X layer;
a hole transport layer disposed on said narrow bandgap perovskite layer; and
an electrode disposed on said hole transport layer, wherein
said Y layer does not comprise a conductive transparent oxide material;
said X layer is absent or present, and when absent, said narrow bandgap perovskite layer is disposed on said ion-doped fullerene layer; and
said Y layer is absent or present, and when absent, said metal oxide layer is disposed on said wide bandgap perovskite layer.

III. Layers, Substrates, and Electrodes

In certain embodiments, the double junction tandem perovskite solar cell comprises a conductive substrate and an electrode. In certain embodiments, the double junction tandem perovskite solar cell comprises an electrode. In certain embodiments, the conductive substrate and electrode each comprise at least one of lithium, sodium, potassium, rubidium, cesium, francium, beryllium, magnesium, calcium, strontium, barium, radium, boron, aluminum, gallium, indium, thallium, tin, lead, flerovium, bismuth, antimony, tellurium, polonium, scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, copernicium, samarium, neodymium, ytterbium, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, carbon nanowire, carbon nanosheet, carbon nanorod, carbon nanotube, graphite, indium tin oxide (ITO), fluorine-doped tin oxide (FTO), aluminum doped zinc oxide (AZO), antimony-tin mixed oxide (ATO), network of metal/alloy nanowire, or a combination of two or more of the above materials. In certain embodiments, the conductive substrate is selected from the group consisting of indium tin oxide (ITO), aluminum doped zinc oxide (AZO), and fluorine doped tin oxide (FTO). In certain embodiments, the conductive substrate is Indium Tin Oxide (ITO). In certain embodiments, the electrode is selected from the group consisting of Ag, Au, Cu, Al, Cr, Bi, graphite, and a combination thereof. In certain embodiments, the electrode is Cu.

In certain embodiments, the double junction tandem perovskite solar cell comprises one or more hole transport layers. In certain embodiments, the hole transport layer comprises at least one of poly(3,4-ethylene dioxithiophene) (PEDOT) doped with poly(styrene sulfonic acid) (PSS), Spiro-OMeTAD, pm-spiro-OMeTAD, po-spiro-OMeTAD, dopants in spiro-OMeTAD, 4,4'-biskptrichlorosilylpropylphenyl)phenylaminoThiphenyl (TPD-Si2), poly(3-hexyl-2,5-thienylene vinylene) ($P_3HTV$), $C_{60}$, carbon, carbon nanotube, graphene quantum dot, graphene oxide, copper phthalocyanine (CuPc), Polythiophene, poly(3,4-(1hydroxymethyl)ethylenedioxythiophene (PHMEDOT), n-dodecylbenzenesulfonic acid/hydrochloric acid doped poly(aniline) nanotubes (a-PANIN)s, poly(styrene sulfonic acid)-graft-poly(aniline) (PSSA-g-PANI), poly(9.9-dioctylfluorene)-co-N-(4-(1-methylpropyl)phenyl) diphenylamine (PFT), 4,4'-bis(p-trichlorosilylpropylphenyl) phenylaminobiphenyl (TSPP), 5,5'-bis(p-trichlorosilylpropylphenyl) phenylamino-2,20 bithiophene (TSPT), N-propyltriethoxysilane, 3,3,3-trifluoropropyltrichlorosilane or 3-aminopropyltriethoxysilane, Poly(bis(4-phenyl)(2,4,6-trimethylphenyl)amine) (PTAA), (Poly[[(2,4-dimethylphenyl)imino]-1,4-phenylene(9,9-di octyl-9H-fluorene-2,7-diyl)-1,4phenylene], (PF8-TAA)), (Poly [[(2,4-dimethylphenyl)imino]-1,4-phenylene (6,12-dihydro-6,6, 12,12tetraoctylindeno[1,2-b]fluorene-2,8-diyl)-1,4-phenylene]) (PIF8-TAA), poly[[4,8-bis[(2-ethylhexyl)oxy]benzo[1,2-b:4,5-b]dithiophene-2,6-diyl][3-fluoro-2-[(2-ethylhexyl)carbonyl]thieno[3,4-b]thiophenediyl]] (PTB7), poly[N-90-heptadecanyl-2,7-carbazole-alt-5,5-(40,70-di-2-thienyl-20,10,30-benzothiadiazole)] (PCDTBT), Poly[2,5-bis(2-decyldodecyl)pyrrolo[3,4-c]pyrrole-1,4(2H,5H)-di-one-(E)-1,2-di(2,20-bithiophen-5-yl) ethene] (PDPPDBTE), 4,8-dithien-2-yl-benzo[1,2-d;4,5-d']bistriazole-alt-benzo[1,2-b:4,5b']dithiophenes (pBBTa-BDTs), pBBTa-BDT1, pBBTa-BDT2 polymers, poly(3-hexylthiophene) ($P_3HT$), poly(4,4'-bis(N-carbazolyl)-1,1'-biphenyl) (PPN), triarylamine (TAA) and/or thiophene moieties, Paracyclophane, Triptycene, and Bimesitylene, Thiophene and Furan-based hole transport materials, Dendrimer-like and star-type hole transport materials, VO, VOX, MoC, WO, ReO, NiOx, AgOx, CuO, Cu2O, V2O5, CuI, CuS, CuInS2, colloidal quantum dots, lead sulphide (PbS), CuSCN, Cu2ZnSnS4, Au nanoparticles and their derivatives. Thiophene derivatives, Triptycene derivatives, Triazine derivatives, Porphyrin derivatives, Triphenylamine derivatives, Tetrathiafulvalene derivatives, Carbazole derivatives and Phthalocyanine derivatives. As used herein, when a material is referred to a "derivate" or as "derivatives," such as Triphenylamine derivatives, the material contains Triphenylamine in its backbone structure. In certain embodiments, the hole transport layer is selected from the group consisting of poly (triaryl amine) (PTAA), poly(3-hexylthiophene) ($P_3HT$), poly(3,4-ethylenedioxythiophene) polystyrene sulfonate (PEDOT:PSS), $NiO_x$, N4,N40-bis(4-(6-((3-ethyloxetan-3-yl)methoxy)hexyl)phenyl)-N4,N40-diphenyl-biphenyl-4,40-di amine (TPD), 2,2',7,7'-Tetrakis[N,N-di(4-methoxyphenyl)amino]-9,9'-spirobifluorene (spiro-OMeTAD), CuSCN, and a combination thereof. In certain embodiments, the hole transport layer comprises poly(triaryl amine) (PTAA). In certain embodiments, the hole transport layer comprises poly(3-hexylthiophene) ($P_3HT$).

In certain embodiments, the double junction tandem perovskite solar cell comprises one or more electron transport layers. In certain embodiments, each electron transport layer comprises at least one of LiF, CsP, LiCoO, CsCO, TiOX, TiO, nanorods (NRs), ZnO, ZnO nanorods (NRs), ZnO nanoparticles (NPs), ZnO, Al—O, CaO, bathocuproine (BCP), copper phthalocyanine (CuPc), pentacene, pyronin B, pentadecafluorooctyl phenyl-C60-butyrate (F-PCBM), C60, C60/LiF, ZnO NRS/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr DBT15), fluorene alternating and random copolymer bearing cationic groups in the alkyl side chains (PFPNBr), poly (ethylene oxide) (PEO), and fullerene derivatives. In certain embodiments, the electron transport layer comprises a material selected from the group consisting of fullerene ($C_{60}$), phenyl-$C_{61}$-butryric acid methyl ester (PCBM), indene Cho bis adduct (ICBA), $TiO_2$, $SnO_2$, ZnO, bathocuproine (BCP), and a combination thereof. In certain embodiments, the electron transport layer comprises fullerene ($C_{60}$) and bathocuproine (BCP). In certain embodiments, the electron transport layer comprises $TiO_2$ or $SnO_2$.

The double junction tandem perovskite solar cell disclosed herein comprises a narrow bandgap perovskite layer and a wide bandgap perovskite layer. Each of the narrow bandgap perovskite layer and wide bandgap perovskite layer comprise an organic-inorganic perovskite compound of formula $ABX_3$. The perovskite compound of formula $ABX_3$ in each of the narrow bandgap perovskite layer and the wide bandgap perovskite layer are different from one another.

In the perovskite formula of $ABX_3$, A comprises at least one cation selected from the group consisting of methylammonium, tetramethylammonium, formamidinium, cesium, rubidium, potassium, sodium, butylammonium, phenethylammonium, phenylammonium, and guanidinium.

In certain embodiments, A comprises an ammonium, an organic cation of the general formula $[NR_4]^+$ where the R groups can be the same or different groups. Suitable R groups include, but are not limited to: methyl, ethyl, propyl, butyl, pentyl group or isomer thereof; any alkane, alkene, or alkyne $C_xH_y$, where $x=1-20$, $y=1-42$, cyclic, branched or straight-chain; alkyl halides, $C_xH_yX_z$, $x=1-20$, $y=0-42$, $z=1-42$, $X=F$, Cl, Br, or I; any aromatic group (e.g., phenyl, alkylphenyl, alkoxyphenyl, pyridine, naphthalene); cyclic complexes where at least one nitrogen is contained within the ring (e.g., pyridine, pyrrole, pyrrolidine, piperidine, tetrahydroquinoline); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (e.g., acetic acid, propanoic acid); and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, $—OC_xH_y$, where $x=0-20$, $y=1-42$. In certain embodiments, A comprises methylammonium, ($CH_3NH_3^+$).

In certain embodiments, A comprises a formamidinium, an organic cation of the general formula $[R_2NCHNR_2]^+$ where the R groups can be the same or different groups. Suitable R groups include, but are not limited to: hydrogen, methyl, ethyl, propyl, butyl, pentyl or an isomer thereof; any alkane, alkene, or alkyne $C_xH_y$, where $x=1-20$, $y=1-42$, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., imidazole, benzimidazole, dihydropyrimidine, (azolidinylidenemethyl)pyrrolidine, triazole); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —$OC_xH_y$, where x=0-20, y=1-42. In certain embodiments A comprises a formamidinium ion represented by ($H_2N$=CH—$NH_2^+$).

In certain embodiments, A comprises a guanidinium, an organic cation of the general formula $[(R_2N)_2C=NR_2]^+$ where the R groups can be the same or different groups. Suitable R groups include, but are not limited to: hydrogen, methyl, ethyl, propyl, butyl, pentyl group or isomer thereof; any alkane, alkene, or alkyne $C_xH_y$, where x=1-20, y=1-42, cyclic, branched or straight-chain; alkyl halides, $C_xH_yX_z$, x=1-20, y=0-42, z=1-42, X=F, Cl, Br, or I; any aromatic group (e.g., phenyl, alkylphenyl, alkoxyphenyl, pyridine, naphthalene); cyclic complexes where at least one nitrogen is contained within the ring (e.g., octahydropyrimido[1,2-a]pyrimidine, pyrimido[1,2-a]pyrimidine, hexahydroimidazo[1,2-a]imidazole, hexahydropyrimidin-2-imine); any sulfur-containing group (e.g., sulfoxide, thiol, alkyl sulfide); any nitrogen-containing group (nitroxide, amine); any phosphorous containing group (phosphate); any boron-containing group (e.g., boronic acid); any organic acid (acetic acid, propanoic acid) and ester or amide derivatives thereof; any amino acid (e.g., glycine, cysteine, proline, glutamic acid, arginine, serine, histindine, 5-ammoniumvaleric acid) including alpha, beta, gamma, and greater derivatives; any silicon containing group (e.g., siloxane); and any alkoxy or group, —$OC_xH_y$, where x=0-20, y=1-42. In certain embodiments, A comprises a guanidinium ion of the type ($H_2N$=C—$(NH_2)_2^+$).

In certain embodiments, A comprises an alkali metal cation, such as $Li^+$, $Na^+$, $K^+$, $Rb^+$, or $Cs^+$.

In certain embodiments, the perovskite crystal structure composition may be substituted (e.g., by partial substitution of the cation A and/or the metal B) with another element, which may be, for example, an alkali metal (e.g., $Li^+$, $Na^+$, $K^+$, $Rb^+$, or $Cs^+$), an alkaline earth metal (e.g., $Mg^{+2}$, $Ca^{+2}$, $Sr^{+2}$, $Ba^{+2}$) or other divalent metal, such as provided below for B, but different from B (e.g., $Sn^{+2}$, $Pb^{2+}$, $Zn^{+2}$, $Cd^{+2}$, $Ge^{+2}$, $Ni^{+2}$, $Pt^{+2}$, $Pd^{+2}$, $Hg^{+2}$, $Si^{+2}$, $Ti^{+2}$), or a Group 15 element, such as Sb, Bi, As, or P, or other metals, such as silver, copper, gallium, indium, thallium, molybdenum, or gold, typically in an amount of up to or less than about 1, 5, 10, 20, 25, 30, 35, 40, 45, 50, 55, 60, 65, 70, 75, 80, 85, 90, 95, 99, or 100 mol % of A or B. A may comprise a mixture of cations. B may comprise a mixture of cations.

The variable B comprises at least one divalent (B') metal atom. The divalent metal (B) can be, for example, one or more divalent elements from Group 14 of the Periodic Table (e.g., divalent lead, tin, or germanium), one or more divalent transition metal elements from Groups 3-12 of the Periodic Table (e.g., divalent titanium, vanadium, chromium, manganese, iron, cobalt, nickel, copper, zinc, palladium, platinum, and cadmium), and/or one or more divalent alkaline earth elements (e.g., divalent magnesium, calcium, strontium, and barium).

The variable X is independently selected from one or a combination of halide atoms, wherein the halide atom (X) may be, for example, fluoride ($F^-$), chloride ($Cl^-$), bromide ($Br^-$), and/or iodide ($F^-$).

In certain embodiments, the narrow bandgap perovskite layer comprises an organic-inorganic halide perovskite of the formula $ABX_3$, wherein A comprises a combination of methylammonium (MA), formamidinium (FA), and cesium or a combination of formamidinium (FA) and cesium; B comprises a combination of Pb and Sn; and X is I. In certain embodiments, the narrow bandgap perovskite layer has a composition of $Cs_{0.05}MA_{0.45}FA_{0.5}Pb_{0.5}Sn_{0.5}I_3$ or $Cs_{0.2}FA_{0.8}Pb_{0.5}Sn_{0.5}I_3$.

In certain embodiments, the wide bandgap perovskite layer comprises an organic-inorganic halide perovskite of the formula $ABX_3$, wherein A comprises a combination of methylammonium (MA), formamidinium (FA), and cesium or a combination of formamidinium (FA) and cesium; B is lead; and X is a combination of I and Br. In certain embodiments, the wide bandgap perovskite layer has a composition selected from the group consisting of $(FA_{0.83}MA_{0.17})_{0.95}Cs_{0.05}Pb(I_{0.6}Br_{0.4})_3$, $Cs_{0.4}FA_{0.6}PbI_{1.95}Br_{1.05}$, and $Cs_{0.2}FA_{0.8}PbI_{1.8}Br_{1.2}$.

In certain embodiments, the narrow bandgap perovskite layer has a composition of $Cs_{0.05}MA_{0.45}FA_{0.5}Pb_{0.5}Sn_{0.5}I_3$ having a bandgap of about 1.23 eV and the wide bandgap perovskite layer has a composition of $Cs_{0.2}FA_{0.8}PbI1.8Br_{1.2}$ having a bandgap of about 1.78 eV.

In certain embodiments, the perovskite double junction tandem solar cells disclosed herein comprise one sub cell comprising a narrow bandgap perovskite layer and another sub cell comprising a wide bandgap perovskite layer. In certain embodiments, the wide bandgap perovskite layer comprises a perovskite having a bandgap of about 1.50 eV to about 2.0 eV. In certain embodiments, the wide bandgap perovskite comprises a perovskite having a bandgap of about 1.65 to about 1.85 eV, about 1.60 eV to about 1.90 eV, about 1.65 eV to about 1.95 eV, about 1.85 eV to about 2.10 eV, about 2.0 eV to about 2.25 eV, or about 2.15 eV to about 2.50 eV. In certain embodiments, the wide bandgap perovskite layer comprises a perovskite having a bandgap of about 1.70 eV, 1.71 eV, 1.72 eV, 1.73 eV, 1.74 eV, 1.75 eV, 1.76 eV, 1.77 eV, 1.78 eV, 1.79 eV, 1.80 eV, 1.81 eV, 1.82 eV, 1.85 eV, 1.86 eV, 1.87 eV, 1.88 eV, 1.89 eV, or 1.90 eV. In certain embodiments, the narrow bandgap perovskite layer comprises a perovskite having a bandgap of about 1.0 eV to about 1.5 eV. In certain embodiments, the narrow bandgap perovskite comprises a perovskite having a bandgap of about 1.0 eV to about 1.45 eV, about 1.15 to about 1.25, about 1.20 to about 1.40, about 1.35 to about 1.45, or about 1.05 to about 1.35. In certain embodiments, the narrow bandgap perovskite layer comprises a perovskite having a bandgap of about 1.10 eV, 1.11 eV, 1.12 eV, 1.13 eV, 1.14 eV, 1.15 eV, 1.16 eV, 1.17 eV, 1.18 eV, 1.19 eV, 1.20 eV, 1.21 eV, 1.22 eV, 1.23 eV, 1.24 eV, 1.25 eV, 1.26 eV, 1.27 eV, 1.28 eV, 1.29 eV, or 1.30 eV.

In certain embodiments, the perovskite double junction tandem solar cells disclosed herein comprise a double interconnection layer comprising an ion-doped fullerene layer and a metal oxide layer disposed on the ion-doped fullerene layer. In certain embodiments, the interconnection layer consists essentially of an ion-doped fullerene layer and a metal oxide layer disposed on the ion-doped fullerene layer. In certain embodiments, the ion-doped fullerene layer comprises a fullerene selected from the group consisting of $C_{60}$, $C_{70}$, $C_{60}$ self-assembly molecules, phenyl-C61-butryric acid methyl ester (PCBM), and indene C60 bis adduct (ICBA). In certain embodiments, the ion-doped fullerene layer comprises a fullerene selected from the group consisting of $C_{60}$, phenyl-C61-butryric acid methyl ester (PCBM), and indene C60 bis adduct (ICBA). In certain embodiments, the ion-doped fullerene layer is $C_{60}$.

In certain embodiments, the ion-doped fullerene layer is doped with an ion selected from the group consisting of iodine ($I^-$), bromine ($Br^-$), chlorine ($Cl^-$), and fluorine ($F^-$). In certain embodiments, the ion-doped fullerene layer is doped with iodine ($I^-$). In certain embodiments, the ion-doped fullerene layer is doped with an ion from about 0% to about 70% the weight of the fullerene layer. In certain embodiments, the ion-doped fullerene layer is doped from about 0.0001% to about 75%, about 0.0001% to about 50%, about 0.005% to about 35%, about 0.10% to about 30%, about 1% to about 25%, about 5% to about 20%, or about 10% to about 15% the weight of the fullerene layer. In certain embodiments, the ion-doped fullerene layer is doped with an ion to an amount sufficient such that it is $n^+$-type.

In certain embodiments, the ion-doped fullerene layer has a thickness of about 1 nm to about 200 nm. In certain embodiments, the ion-doped fullerene layer has a thickness of about 5 nm to about 150 nm, about 10 nm to 125 nm, about 20 nm to 110 nm, about 50 nm to about 100 nm, about 25 nm to about 75 nm, or about 15 nm to about 95 nm. In certain embodiments, the ion-doped fullerene layer has a thickness of about 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, or 40 nm.

In certain embodiments, the metal oxide layer is a metal oxide selected from the group consisting of $SnO_{2-x}$ (0<x<1), $Al_2O_{3-x}$ (0<x<3), $TiO_{2-x}$ (0<x<1), $ZnO_{1-x}$ (0<x<1), $Ga_2O_3$ (0<x<3), $V_2O_{5-x}$ (0<x<5), and $MoO_{3-x}$ (0<x<3). In certain embodiments, the metal oxide is $SnO_{2-x}$ (0<x<1). In certain embodiments, x in $SnO_{2-x}$ (0<x<1) is about 0.05, 0.07, 0.09, 0.10, 0.11, 0.12, 0.13, 0.14, 0.15, 0.16, 0.17, 0.18, 0.19, 0.20, 0.25, 0.30, 0.45, 0.50, 0.70, 0.75, 0.85, 0.90, or about 0.95.

Atomic layer deposition is a thin-film deposition technique based on the sequential use of a gas phase chemical process. In the art, it has been demonstrated that preparing $SnO_{2-x}$ (0<x<1) by high temperature processes, or annealing $SnO_{2-x}$ (0<x<1) at temperatures of at least 300° C. increases the oxygen vacancy concentration and the electron concentration of the material to about $10^{18}$ cm$^{-3}$ (22-25). It was discovered that by preparing $SnO_{2-x}$ (0<x<1) at low temperatures, such as by low temperature atomic layer deposition, the oxygen vacancy concentration and electron concentration could be reduced. Without wishing to be bound by theory, it is understood that the light doping of the $SnO_{2-x}$ (0<x<1) contributed to the material's bipolar charge properties.

In certain embodiments, $SnO_{2-x}$ (0<x<1) is prepared by atomic layer deposition at about 80° C. to about 180° C., about 90° C. to about 170° C., about 100° C. to 150° C., about 125° C. to 175° C., or about 135° C. to 165° C. In certain embodiments, $SnO_{2-x}$ (0<x<1) is prepared by atomic layer deposition at about 100° C.

In certain embodiments, $SnO_{2-x}$ is an alloy of SnO and $SnO_2$. SnO is p-type with a band gap of about 0.7 to about 1 eV and $SnO_2$ is n-type with a bandgap of about 3.6 eV. As such, there is a gap state in $SnO_{2-x}$ that is in line with the valance band of the perovskite semiconductor in the solar cell. Therefore, $SnO_{2-x}$ can receive holes from the perovskite, and can transport both electrons and holes. In certain embodiments, the $SnO_{2-x}$ alloy exhibits bipolar transport properties, wherein said bipolar transport properties comprise the ability to accept holes from said narrow bandgap perovskite layer and transport both electrons and holes. In certain embodiments, the $SnO_{2-x}$ alloy exhibits bipolar transport properties, wherein said bipolar transport properties comprise the ability to accept holes from said wide bandgap perovskite layer and transport both electrons and holes. In certain embodiments, the $SnO_{2-x}$ alloy exhibits bipolar transport properties, wherein said bipolar transport properties comprise the ability to accept holes from said wide bandgap perovskite layer and/or said narrow bandgap perovskite layer and transport both electrons and holes. In certain embodiments, the metal oxide layer exhibits bipolar transport properties, wherein said bipolar transport properties comprise the ability to accept holes from said wide bandgap perovskite layer and/or said narrow bandgap perovskite layer and transport both electrons and holes. In certain embodiments, the metal oxide layer exhibits bipolar transport properties, wherein said bipolar transport properties comprise the ability to accept holes from said narrow bandgap perovskite layer and transport both electrons and holes. In certain embodiments, the metal oxide layer exhibits bipolar transport properties, wherein said bipolar transport properties comprise the ability to accept holes from said wide bandgap perovskite layer and transport both electrons and holes. In certain embodiments, $SnO_{2-x}$ (0<x<1) can act as both an electron transport layer and a hole transport layer. In certain embodiments, $SnO_{2-x}$ (0<x<1) is n-type. In certain embodiments, $SnO_{2-x}$ (0<x<1) is oxygen deficient. In certain embodiments, $SnO_{2-x}$ (0<x<1) has field-effect mobilities of $9.7\times10^{-2}$ cm$^2$ V$^{-1}$ s$^{-1}$ for electrons and $1.2\times10^{-2}$ cm$^2$ V$^{-1}$ s$^{-1}$ for holes. In certain embodiments, $SnO_{2-x}$ has a majority electron concentration of $9.0\times10^{16}$ cm$^{-3}$. In certain embodiments, $SnO_{2-x}$ has an electron mobility of $4.5\times10^{-2}$ cm$^2$ V$^{-1}$ s$^{-1}$. In certain embodiments, $SnO_{2-x}$ has a conductivity of $6.5\times10^{-4}$ S cm$^{-1}$.

In certain embodiments, the metal oxide layer has a thickness of about 1 nm to about 300 nm. In certain embodiments, the metal oxide layer has a thickness of about 2 nm to about 200 nm, about 5 nm to about 150 nm, about 10 nm to about 100 nm, about 25 nm to about 75 nm, or about 50 to about 200 nm. In certain embodiments, the metal oxide later has a thickness of about 5 nm, 6 nm, 7 nm, 8 nm, 9 nm, 10 nm, 11 nm, 12 nm, 13 nm, 14 nm, or 15 nm.

In certain embodiments, the metal oxide layer has bipolar transport properties. In certain embodiments, the metal oxide layer has the ability to accept holes from the narrow bandgap perovskite layer and transport both electrons and holes. In certain embodiments, the metal oxide layer has the ability to accept holes from the narrow bandgap perovskite layer and transport both electrons and holes.

In certain embodiments, the metal oxide layer is n type and the ion-doped fullerene layer is $n^+$ type and together they comprise a $n/n^+$ interconnection structure. In certain embodiments, the metal oxide layer and the ion-doped fullerene layer consist essentially of a $n/n^+$ interconnection structure.

In certain embodiments, the X layer and the Y layer are both absent in the double junction tandem perovskite solar. In certain embodiments, the X layer and the Y layer are each present. In certain embodiments, the X layer is present and the Y layer is absent. In certain embodiments, when the X layer is present, the X layer comprises an electron transport layer. In certain embodiments, when the X layer is present, the X layer comprises a material selected from the group consisting of phenyl-$C_{61}$-butryric acid methyl ester (PCBM), indene Cho bis adduct (ICBA), $TiO_2$, $SnO_{2-x}$ bathocuproine (BCP), and a combination thereof. In certain embodiments, when the X layer is present, the X layer is indene $C_{60}$ bis adduct (ICBA). In certain embodiments, when the X layer is present, the X layer is $TiO_2$ or $SnO_2$.

In certain embodiments, the Y layer is present and the X layer is absent. In certain embodiments, when the Y layer is present, the Y layer comprises a hole transport layer. In certain embodiments, when the Y layer is present, the Y layer comprises a material selected from the group consisting of poly(triaryl amine) (PTAA), poly(3,4-ethylenedioxythiophene) polystyrene sulfonate (PEDOT:PSS), poly(3-hexylthiophene) ($P_3HT$), $NiO_x$, N4,N40-bis(4-(6-((3-ethyloxetan-3-yl)methoxy)hexyl)phenyl)-N4,N40-diphenyl-biphenyl-4,40-diamine (TPD), 2,2',7,7'-Tetrakis[N,N-di(4-methoxyphenyl)amino]-9,9'-spirobifluorene (spiro-OMeTAD), CuSCN, and a combination thereof. The Y layer does not comprise a conductive transparent oxide material. As used herein, conductive transparent oxide materials are indium tin oxide (ITO), fluorine-doped tin oxide (FTO), aluminum doped zinc oxide (AZO), and antimony-tin mixed oxide (ATO). In certain embodiments, when the Y layer is present, the Y layer is PTAA. In certain embodiments, when the Y layer is present, the Y layer is poly(3-hexylthiophene) $P_3HT$.

The subject matter described herein is directed to the following embodiments:

1. A double junction tandem perovskite solar cell comprising:
   a transparent conductive substrate;
   a hole transport layer disposed on said conductive substrate;
   a wide bandgap perovskite layer disposed on said hole transport layer;
   an X layer disposed on said wide bandgap perovskite layer;
   an ion-doped fullerene layer disposed on said X layer;
   a metal oxide layer disposed on said ion-doped fullerene layer, wherein said metal oxide layer is a metal oxide selected from the group consisting of $SnO_{2-x}$ ($0<x<1$), $Al_2O_{3-x}$ ($0<x<3$), $TiO_{2-x}$ ($0<x<1$), $ZnO_{1-x}$ ($0<x<1$), $Ga_2O_{3-x}$ ($0<x<3$), $V_2O_{5-x}$ ($0<x<5$), and $MoO_{3-x}$ ($0<x<3$);
   a Y layer disposed on said metal oxide layer;
   a narrow bandgap perovskite layer disposed on said Y layer;
   an electron transport layer disposed on said narrow bandgap perovskite layer; and
   an electrode disposed on said electron transport layer, wherein
   said Y layer does not comprise a conductive transparent oxide material;
   said X layer is absent or present, and when absent, said ion-doped fullerene layer is disposed on said wide bandgap perovskite layer; and
   said Y layer is absent or present, and when absent, said narrow bandgap perovskite layer is disposed on said metal oxide layer.

2. The double junction tandem perovskite solar cell of embodiment 1, wherein said ion-doped fullerene layer is doped with an ion selected from the group consisting of iodine ($I^-$), bromine ($Br^-$), chlorine ($Cl^-$), and fluorine ($F^-$).

3. The double junction tandem perovskite solar cell of embodiments 1 or 2, wherein said ion-doped fullerene layer is doped with iodine ($I^-$).

4. The double junction tandem perovskite solar cell of any one of embodiments 1-3, wherein said ion-doped fullerene layer comprises a fullerene selected from the group consisting of $C_{60}$, $C_{70}$, $C_{60}$ self-assembly molecules, phenyl-$C_{61}$-butryric acid methyl ester (PCBM), and indene $C_{60}$ bis adduct (ICBA).

5. The double junction tandem perovskite solar cell of any one of embodiments 1-4, wherein said fullerene is $C_{60}$.

6. The double junction tandem perovskite solar cell of any one of embodiments 1-5, wherein said ion-doped fullerene layer has a thickness of about 1 nm to about 200 nm.

7. The double junction tandem perovskite solar cell of any one of embodiments 1-6, wherein said ion-doped fullerene layer has a thickness of about 30 nm.

8. The double junction tandem perovskite solar cell of any one of embodiments 1-7, wherein said metal oxide is $SnO_{2-x}$ ($0<x<1$).

9. The double junction tandem perovskite solar cell of any one of embodiments 1-8, wherein x in $SnO_{2-x}$ ($0<x<1$) is about 0.15.

10. The double junction tandem perovskite solar cell of any one of embodiments 1-9, wherein $SnO_{2-x}$ ($0<x<1$) is an alloy comprising p-type SnO and n-type $SnO_2$, wherein said p-type SnO has a bandgap of about 0.7 eV to about 1.0 eV and said n-type $SnO_2$ has a bandgap of about 3.6 eV.

11. The double junction tandem perovskite solar cell of any one of embodiments 1-10, wherein said alloy exhibits bipolar transport properties, wherein said bipolar transport properties comprise the ability to accept holes from said narrow bandgap perovskite layer and transport both electrons and holes.

12. The double junction tandem perovskite solar cell of any one of embodiments 1-11, wherein $SnO_{2-x}$ ($0<x<1$) is prepared by atomic layer deposition at about 80° C. to about 180° C.

13. The double junction tandem perovskite solar cell of any one of embodiments 1-12, wherein said metal oxide layer has a thickness of about 1 nm to about 300 nm.

14. The double junction tandem perovskite solar cell of any one of embodiments 1-13, wherein said metal oxide layer has a thickness of about 9 nm.

15. The double junction tandem perovskite solar cell of any one of embodiments 1-14, wherein said metal oxide layer exhibits bipolar transport properties, wherein said bipolar transport properties comprise the ability to accept holes from said narrow bandgap perovskite layer and transport both electrons and holes.

16. The double junction tandem perovskite solar cell of any one of embodiments 1-15, wherein said wide bandgap perovskite layer has a bandgap of about 1.5 eV to about 2 eV and said narrow bandgap perovskite layer has a bandgap of about 1.0 eV to about 1.5 eV.

17. The double junction tandem perovskite solar cell of any one of embodiments 1-16, wherein said wide bandgap perovskite layer has a bandgap of about 1.80 eV.

18. The double junction tandem perovskite solar cell of any one of embodiments 1-17, wherein said narrow bandgap perovskite layer has a bandgap of about 1.20 eV.

19. The double junction tandem perovskite solar cell of any one of embodiments 1-18, wherein said narrow and said wide bandgap perovskite layer are different from each other, and comprise an organic-inorganic halide perovskite of the formula $ABX_3$ wherein A comprises a cation selected from the group consisting of methylammonium (MA), tetramethylammonium, formamidinium (FA), cesium, rubidium, potassium, sodium, butylammonium, phenethylammonium, phenylammonium, guanidinium, and a combination thereof; B comprises a divalent metal selected from the group consisting of lead, tin, cadmium, germanium, zinc, nickel, platinum, palladium, mercury, titanium, silicon, and a combination thereof; and X is a halide selected from the group consisting of Cl, Br, F, I, and a combination thereof.

20. The double junction tandem perovskite solar cell of any one of embodiments 1-19, wherein said narrow bandgap perovskite layer comprises an organic-inorganic halide perovskite of the formula $ABX_3$, wherein A comprises a combination of methylammonium (MA), formamidinium (FA), and cesium or a combination of formamidinium (FA) and cesium; B comprises a combination of Pb and Sn; and X is I.

21. The double junction tandem perovskite solar cell of any one of embodiments 1-20, wherein said narrow bandgap perovskite layer has a composition of $Cs_{0.05}MA_{0.45}FA_{0.5}Pb_{0.5}Sn_{0.5}I_3$ or a composition of $Cs_{0.2}FA_{0.8}Pb_{0.5}Sn_{0.5}I_3$.

22. The double junction tandem perovskite solar cell of any one of embodiments 1-21, wherein said wide bandgap perovskite layer comprises an organic-inorganic halide perovskite of the formula $ABX_3$, wherein A comprises a combination of methylammonium (MA), formamidinium (FA), and cesium, or a combination of formamidinium (FA) and cesium; B is lead; and X is a combination of I and Br.

23. The double junction tandem perovskite solar cell of any one of embodiments 1-22, wherein said wide bandgap perovskite layer has a composition selected from the group consisting of $(FA_{0.83}MA_{0.17})_{0.95}Cs_{0.05}Pb(I_{0.6}Br_{0.4})_3$, $Cs_{0.4}FA_{0.6}PbI_{1.95}Br_{1.05}$, and $Cs_{0.2}FA_{0.8}PbI_{1.8}Br_{1.2}$.

24. The double junction tandem perovskite solar cell of any one of embodiments 1-23, wherein said narrow bandgap perovskite layer has a composition of $Cs_{0.05}MA_{0.45}FA_{0.5}Pb_{0.5}Sn_{0.5}I_3$ having a bandgap of about 1.23 eV and said wide bandgap perovskite layer has a composition of $Cs_{0.2}FA_{0.8}PbI_{1.8}Br_{1.2}$ having a bandgap of about 1.78 eV.

25. The double junction tandem perovskite solar cell of any one of embodiments 1-24, wherein said electron transport layer comprises a material selected from the group consisting of fullerene ($C_{60}$), $C_{70}$, $C_{60}$ self-assembly molecules, phenyl-$C_{61}$-butryric acid methyl ester (PCBM), indene $C_{60}$ bis adduct (ICBA), $TiO_2$, $SnO_2$, ZnO, bathocuproine (BCP), and a combination thereof.

26. The double junction tandem perovskite solar cell of any one of embodiments 1-25, wherein said electron transport layer comprises fullerene ($C_{60}$) and bathocuproine (BCP).

27. The double junction tandem perovskite solar cell of any one of embodiments 1-26, wherein said hole transport layer comprises a material selected from the group consisting of poly(triaryl amine) (PTAA), poly(3-hexylthiophene) ($P_3HT$), poly(3,4-ethylenedioxythiophene) polystyrene sulfonate (PEDOT:PSS), $NiO_x$, N4,N40-bis(4-(6-((3-ethyloxetan-3-yl)methoxy)hexyl)phenyl)-N4,N40-diphenyl-biphenyl-4,40-diamine (TPD), 2,2',7,7'-Tetrakis[N,N-di(4-methoxyphenyl)amino]-9,9'-spirobifluorene (spiro-OMeTAD), CuSCN, and a combination thereof.

28. The double junction tandem perovskite solar cell of any one of embodiments 1-27, wherein said hole transport layer comprises poly(triaryl amine) (PTAA).

29. The double junction tandem perovskite solar cell of any one of embodiments 1-28, wherein said conductive substrate is selected from the group consisting of Indium Tin Oxide (ITO), Aluminum Doped Zinc Oxide (AZO), and Fluorine doped Tin Oxide (FTO).

30. The double junction tandem perovskite solar cell of any one of embodiments 1-29, wherein said conductive substrate is Indium Tin Oxide (ITO).

31. The double junction tandem perovskite solar cell of any one of embodiments 1-30, wherein said electrode is selected from the group consisting of Ag, Au, Cu, Al, Cr, Bi, graphite, and a combination thereof.

32. The double junction tandem perovskite solar cell of any one of embodiments 1-31, wherein said electrode is Cu.

33. The double junction tandem perovskite solar cell of any one of embodiments 1-32, wherein said X layer and said Y layer are both absent.

34. The double junction tandem perovskite solar cell of any one of embodiments 1-33, wherein said metal oxide layer and said ion-doped fullerene layer comprise a $n/n^+$ interconnection structure.

35. The double junction tandem perovskite solar cell of any one of embodiments 1-34, wherein said X layer is present and comprises a material selected from the group consisting of phenyl-$C_{61}$-butryric acid methyl ester (PCBM), indene Cho bis adduct (ICBA), $TiO_2$, $SnO_2$, ZnO, bathocuproine (BCP), and a combination thereof.

36. The double junction tandem perovskite solar cell of any one of embodiments 1-35, wherein said X layer is indene $C_{60}$ bis adduct (ICBA).

37. The double junction tandem perovskite solar cell of any one of embodiments 1-36, wherein said Y layer is absent.

38. The double junction tandem perovskite solar cell of any one of embodiments 1-37, wherein said Y layer is present and comprises a material selected from the group consisting of poly(triaryl amine) (PTAA), poly(3-hexylthiophene) ($P_3HT$), poly(3,4-ethylenedioxythiophene) polystyrene sulfonate (PEDOT:PSS), $NiO_x$, N4,N40-bis(4-(6-((3-ethyloxetan-3-yl)methoxy)hexyl)phenyl)-N4,N40-diphenyl-biphenyl-4,40-diamine (TPD), 2,2',7,7'-Tetrakis[N,N-di(4-methoxyphenyl)amino]-9,9'-spirobifluorene (spiro-OMeTAD), CuSCN, and a combination thereof.

39. The double junction tandem perovskite solar cell of any one of embodiments 1-38, wherein said X layer is absent.

40. The double junction tandem perovskite solar cell of any one of embodiments 1-39, wherein said X layer and said Y layer are each present.

41. A double junction tandem perovskite solar cell comprising:
a conductive substrate;
an electron transport layer disposed on said conductive substrate;
a wide bandgap perovskite layer disposed on said electron transport layer;
a Y layer disposed on said wide bandgap perovskite layer;
a metal oxide layer disposed on said Y layer, wherein said metal oxide layer is a metal oxide selected from the group consisting of $SnO_{2-x}$ (0<x<1), $Al_2O_{3-x}$ (0<x<3), $TiO_{2-x}$ (0<x<1), $ZnO_{1-x}$ (0<x<1), $Ga_2O_3$ (0<x<3), $V_2O_{5-x}$ (0<x<5), and $MoO_{3-x}$ (0<x<3);
an ion-doped fullerene layer disposed on said metal oxide layer;
an X layer disposed on said ion-doped fullerene layer;
a narrow bandgap perovskite layer disposed on said X layer;
a hole transport layer disposed on said narrow bandgap perovskite layer; and
an electrode disposed on said hole transport layer,
wherein
said Y layer does not comprise a conductive transparent oxide material;
said X layer is absent or present, and when absent, said narrow bandgap perovskite layer is disposed on said ion-doped fullerene layer; and said Y layer is absent or present, and when absent, said metal oxide layer is disposed on said wide bandgap perovskite layer.

42. The double junction tandem perovskite solar cell of embodiment 41, wherein said ion-doped fullerene layer is doped with an ion selected from the group consisting of iodine (I⁻), bromine (Br⁻), chlorine (Cl⁻), and fluorine (F⁻).

43. The double junction tandem perovskite solar cell of embodiment 41 or 42, wherein said ion-doped fullerene layer is doped with iodine (I).

44. The double junction tandem perovskite solar cell of any one of embodiments 41-43, wherein said ion-doped fullerene layer comprises a fullerene selected from the group consisting of $C_{60}$, $C_{70}$, $C_{60}$ self-assembly molecules, phenyl-$C_{61}$-butryric acid methyl ester (PCBM), and indene $C_{60}$ bis adduct (ICBA).

45. The double junction tandem perovskite solar cell of any one of embodiments 41-44, wherein said fullerene is $C_{60}$.

46. The double junction tandem perovskite solar cell of any one of embodiments 41-45, wherein said ion-doped fullerene layer has a thickness of about 1 nm to about 200 nm.

47. The double junction tandem perovskite solar cell of any one of embodiments 41-46, wherein said ion-doped fullerene layer has a thickness of about 30 nm.

48. The double junction tandem perovskite solar cell of any one of embodiments 41-47, wherein said metal oxide is $SnO_{2-x}$ ($0<x<1$).

49. The double junction tandem perovskite solar cell of any one of embodiments 41-48, wherein x in $SnO_{2-x}$ ($0<x<1$) is about 0.15.

50. The double junction tandem perovskite solar cell of any one of embodiments 41-49, wherein $SnO_{2-x}$ ($0<x<1$) is an alloy comprising p-type SnO and n-type $SnO_2$, wherein said p-type SnO has a bandgap of about 0.7 eV to about 1.0 eV and said n-type $SnO_2$ has a bandgap of about 3.6 eV.

51. The double junction tandem perovskite solar cell of any one of embodiments 41-50, wherein said alloy exhibits bipolar transport properties, wherein said bipolar transport properties comprise the ability to accept holes from said wide bandgap perovskite layer or said narrow bandgap perovskite layer and transport both electrons and holes.

52. The double junction tandem perovskite solar cell of any one of embodiments 41-51, wherein $SnO_{2-x}$ ($0<x<1$) is prepared by atomic layer deposition at about 80° C. to about 180° C.

53. The double junction tandem perovskite solar cell of any one of embodiments 41-52, wherein said metal oxide layer has a thickness of about 1 nm to about 300 nm.

54. The double junction tandem perovskite solar cell of any one of embodiments 41-53, wherein said metal oxide layer has a thickness of about 9 nm.

55. The double junction tandem perovskite solar cell of any one of embodiments 41-54, wherein said metal oxide layer exhibits bipolar transport properties, wherein said bipolar transport properties comprise the ability to accept holes from wide bandgap perovskite layer or said narrow bandgap perovskite layer and transport both electrons and holes.

56. The double junction tandem perovskite solar cell of any one of embodiments 41-55, wherein said wide bandgap perovskite layer comprises a perovskite having a bandgap of about 1.5 eV to about 2 eV and said narrow bandgap perovskite layer comprises a perovskite having a bandgap of about 1.0 eV to about 1.5 eV.

57. The double junction tandem perovskite solar cell of any one of embodiments 41-56, wherein said wide bandgap perovskite layer comprises a perovskite having a bandgap of about 1.80 eV.

58. The double junction tandem perovskite solar cell of any one of embodiments 41-57, wherein said narrow bandgap perovskite layer comprises a perovskite having a bandgap of about 1.20 eV.

59. The double junction tandem perovskite solar cell of any one of embodiments 41-58, wherein said narrow and said wide bandgap perovskite layer are different from each other, and each comprise an organic-inorganic halide perovskite of the formula $ABX_3$ wherein A comprises a cation selected from the group consisting of methylammonium (MA), tetramethylammonium, formamidinium (FA), cesium, rubidium, potassium, sodium, butylammonium, phenethylammonium, phenylammonium, guanidinium, and a combination thereof; B comprises a divalent metal selected from the group consisting of lead, tin, cadmium, germanium, zinc, nickel, platinum, palladium, mercury, titanium, silicon, and a combination thereof; and X is a halide selected from the group consisting of Cl, Br, F, I, and a combination thereof.

60. The double junction tandem perovskite solar cell of any one of embodiments 41-59, wherein said narrow bandgap perovskite layer comprises an organic-inorganic halide perovskite of the formula $ABX_3$, wherein A comprises a combination of methylammonium (MA), formamidinium (FA), and cesium or a combination of formamidinium (FA) and cesium; B comprises a combination of Pb and Sn; and X is I.

61. The double junction tandem perovskite solar cell of any one of embodiments 41-60, wherein said narrow bandgap perovskite layer has a composition of $Cs_{0.05}MA045FA_{0.5}Pb_{0.5}Sn_{0.5}I_3$ or $Cs_{0.2}FA_{0.8}Pb_{0.5}Sn_{0.5}I_3$.

62. The double junction tandem perovskite solar cell of any one of embodiments 41-61, wherein said wide bandgap perovskite layer comprises an organic-inorganic halide perovskite of the formula $ABX_3$, wherein A comprises a combination of methylammonium (MA), formamidinium (FA), and cesium or a combination of formamidinium (FA) and cesium; B is lead; and X is a combination of I and Br.

63. The double junction tandem perovskite solar cell of any one of embodiments 41-62, wherein said wide bandgap perovskite layer has a composition selected from the group consisting of $(FA_{0.83}MA_{0.17})_{0.95}Cs_{0.05}Pb(I_{0.6}Br_{0.4})_3$, $Cs_{0.4}FA_{0.6}PbI_{1.95}Br_{1.05}$, and $Cs_{0.2}FA_{0.8}PbI_{1.8}Br_{1.2}$.

64. The double junction tandem perovskite solar cell of any one of embodiments 41-63, wherein said narrow bandgap perovskite layer has a composition of $Cs_{0.05}MA_{0.45}FA_{0.5}Pb_{0.5}Sn_{0.5}I_3$ having a bandgap of about 1.23 eV and said wide bandgap perovskite layer has a composition of $Cs_{0.2}FA_{0.8}PbI_{1.8}Br_{1.2}$ having a bandgap of about 1.78 eV.

65. The double junction tandem perovskite solar cell of any one of embodiments 41-64, wherein said electron transport layer comprises a material selected from the group consisting of fullerene ($C_{60}$), $C_{70}$, $C_{60}$ self-assemble molecules, phenyl-$C_{61}$-butryric acid methyl ester (PCBM), indene $C_{60}$ bis adduct (ICBA), $TiO_2$, $SnO_2$, ZnO, bathocuproine (BCP), and a combination thereof.

66. The double junction tandem perovskite solar cell of any one of embodiments 41-65, wherein said electron transport layer comprises $TiO_2$ or $SnO_2$.

67. The double junction tandem perovskite solar cell of any one of embodiments 41-66, wherein said hole transport layer comprises a material selected from the group consisting of poly(triaryl amine) (PTAA), poly(3-hexylthiophene) ($P_3HT$), poly(3,4-ethylenedioxythiophene) polystyrene sulfonate (PEDOT:PSS), $NiO_x$, N4,N40-bis(4-(6-((3-ethyloxetan-3-yl)methoxy)hexyl)phenyl)-N4,N40-diphenyl-biphenyl-4,40-diamine (TPD), 2,2',7,7'-Tetrakis[N,N-di(4- methoxyphenyl)amino]-9,9'-spirobifluorene (spiro-OMeTAD), CuSCN, and a combination thereof.

68. The double junction tandem perovskite solar cell of any one of embodiments 41-67, wherein said hole transport layer comprises poly(3-hexylthiophene) (P$_3$HT).

69. The double junction tandem perovskite solar cell of any one of embodiments 41-68, wherein said conductive substrate is selected from the group consisting of Indium Tin Oxide (ITO), Aluminum Doped Zinc Oxide (AZO), and Fluorine doped Tin Oxide (FTO).

70. The double junction tandem perovskite solar cell of any one of embodiments 41-69, wherein said conductive substrate is Indium Tin Oxide (ITO).

71. The double junction tandem perovskite solar cell of any one of embodiments 41-70, wherein said electrode is selected from the group consisting of Ag, Au, Cu, Al, Cr, Bi, graphite and a combination thereof.

72. The double junction tandem perovskite solar cell of any one of embodiments 41-71, wherein said electrode is Cu or Au.

73. The double junction tandem perovskite solar cell of any one of embodiments 41-72, wherein said X layer and said Y layer are both absent.

74. The double junction tandem perovskite solar cell of any one of embodiments 41-73, wherein said metal oxide layer and said ion-doped fullerene layer comprise a n/n$^+$ interconnection structure.

75. The double junction tandem perovskite solar cell of any one of embodiments 41-74, wherein said X layer is present and comprises a material selected from the group consisting of C$_{60}$, C$_{70}$, C$_{60}$ self-assemble molecules, phenyl-C$_{61}$-butryric acid methyl ester (PCBM), indene C$_{60}$ bis adduct (ICBA), TiO$_2$, SnO$_2$, ZnO, bathocuproine (BCP), and a combination thereof.

76. The double junction tandem perovskite solar cell of any one of embodiments 41-75, wherein said X layer is TiO$_2$ or SnO$_2$.

77. The double junction tandem perovskite solar cell of any one of embodiments 41-76, wherein said Y layer is absent.

78. The double junction tandem perovskite solar cell of any one of embodiments 41-77, wherein said Y layer is present and comprises a material selected from the group consisting of poly(triaryl amine) (PTAA), P$_3$HT, poly(3,4-ethylenedioxythiophene) polystyrene sulfonate (PEDOT:PSS), NiO$_x$, N4,N40-bis(4-(6-((3-ethyloxetan-3-yl)methoxy)hexyl)phenyl)-N4,N40-diphenyl-biphenyl-4,40-diamine (TPD), 2,2',7,7'-Tetrakis[N,N-di(4-methoxyphenyl)amino]-9,9'-spirobifluorene (spiro-OMeTAD), CuSCN, and a combination thereof.

79. The double junction tandem perovskite solar cell of any one of embodiments 41-78, wherein said X layer is absent.

80. The double junction tandem perovskite solar cell of any one of embodiments 41-79, wherein said X layer and said Y layer are each present.

The following examples are offered by way of illustration and not by way of limitation.

EXAMPLES

Materials and Methods

Methylammonium iodide (MAI), methylammonium bromide (MABr) and formamidine iodide (FAI) were purchased from Greatcell Solar. Lead(II) iodide (PbI$_2$, 99.999%), lead (II) bromide (PbBr$_2$, 99.999%), tin (II) iodide (SnI$_2$, 99.999%), tin (II) fluoride (SnF$_2$, 99%), cesium iodide (CsI, 99.999%), acetone (>99.9%), isopropanol alcohol (IPA, 99.5%), toluene (anhydrous, 99.8%), 1,2-dichlorobenzene (DCB, 99%), anhydrous dimethyl sulfoxide (DMSO, 99.8%), poly(bis(4-phenyl)(2,4,6-trimethylphenyl)amine) (PTAA), bathocuproine (BCP), indene-C$_{60}$ bisadduct (ICBA) and anhydrous N,N-Dimethylformamide (DMF, 99.8%) were purchased from Sigma-Aldrich. C$_{60}$ and [6,6]-phenyl-C$_{61}$-butyric acid methyl ester (PCBM), were purchased from NANO-C. Poly(3,4-ethylenedioxythiophene): poly(styrene-sulfonate) PEDOT:PSS (Clevios™ P VP AI 4083) was purchased from Heraues.

Perovskite Precursor Solutions Preparation

The WBG perovskite (1.78 eV) 1.35 M (FA$_{0.83}$MA$_{0.17}$)$_{0.95}$Cs$_{0.05}$Pb(I$_{0.6}$Br$_{0.4}$)$_3$ precursor solution was prepared by dissolving MAI (0.035 g), FAI (0.090 g), CsI (0.018 g), FABr (0.068 g), PbI$_2$ (0.373 g), and PbBr$_2$ (0.198 g) in mixed solvent (1 ml, volume ratio of 2:8) of dimethyl sulphoxide (DMSO) and Dimethylformamide (DMF) and stirring the solution at room temperature for 1 h. For the NBG perovskite (1.23 eV) 1.6 M MA$_{0.45}$FA$_{0.5}$Cs$_{0.05}$Pb$_{0.5}$Sn$_{0.5}$I$_3$ precursor solution was prepared by dissolving MAI (0.114 g), FAI (0.138 g), CsI (0.021 g), PbI$_2$ (0.406 g), SnI$_2$ (0.298 g) and SnF$_2$ (0.013 g) in mixed solvent (1 ml, volume ratio of 2:8) of DMSO and DMF and then stirring the solution at room temperature for 1 h.

The WBG perovskite (1.78 eV), 1.40 M Cs$_{0.2}$FA$_{0.8}$PbI$_{1.8}$Br$_{1.2}$ precursor solution was prepared by dissolving 0.28 M CsI, 1.12 M FAI, 0.84 M PbBr$_2$, 0.59 M PbI$_2$ in mixed solvent of DMSO and DMF (volume ratio of 1:3) and then stirring the solution at room temperature for 1 h. The NBG perovskite (1.23 eV), 1.6 M Cs$_{0.05}$MA$_{0.45}$FA$_{0.5}$Pb$_{0.5}$Sn$_{0.5}$I$_3$ precursor solution was prepared by dissolving 0.72 M MAI, 0.80 M FAI, 0.08 M CsI, 0.80 M PbI$_2$, 0.80 M SnI$_2$ and 0.08 M SnF$_2$ in mixed solvent (volume ratio of 3:7) of DMSO and DMF and then stirring the solution at room temperature for 1 h. For the reference: 1.35 MAPbI$_3$ precursor solution was prepared by dissolving 1.35 M MAI and 1.35 M PbI$_2$ in mixed solvent (volume ratio of 1:9) of DMSO and DMF, which was then stirred at room temperature for 1 h. All the precursor solutions were filtered with 0.22 μm Polytetrafluoroethylene (PTFE) filters before use.

Device Fabrication

Commercial patterned indium tin oxides (ITO) glass substrates were sequentially cleaned by ultra-sonication in deionized water, acetone, and IPA. Afterward, ITO glass substrates were treated in UV ozone for 20 min and transferred into the glove box.

For the fabrication of single junction Cs$_{0.2}$FA$_{0.8}$PbI$_{1.8}$Br$_{1.2}$ WBG perovskite solar cells, 2 mg/mL PTAA dissolved in toluene was spin-coated onto ITO substrates at 5,000 r.p.m. for 30 s, followed by annealing at 100° C. for 10 min. Then, the Cs$_{0.2}$FA$_{0.8}$PbI$_{1.8}$Br$_{1.2}$ precursor solution was spin-coated onto PTAA layers at 4000 r.p.m. for 30 s, which was then quickly casted by 150 μL toluene (or 1 mg/mL ICBA in toluene solution) at 20 s of the spin-coating process. Subsequently, the samples were annealed at 65° C. for 5 min and 100° C. for 10 min. Finally, 20 nm C$_{60}$, 8 nm BCP, and 80 nm copper electrode were sequentially thermally evaporated onto the perovskite films. All device areas were 8 mm$^2$.

For the fabrication of single junction NBG perovskite solar cells, PEDOT:PSS was spin-coated onto the ITO substrates at 5,000 r.p.m. for 30 s, followed by annealing at 150° C. for 10 min. Conversely, 9 nm SnO$_{2-x}$ was deposited onto the ITO substrates by ALD as another HTL. Then, the Cs$_{0.05}$MA$_{0.45}$FA$_{0.5}$Pb$_{0.5}$Sn$_{0.5}$I$_3$ precursor solution was spin-coated onto PEDOT:PSS or SnO$_{2-x}$ substrates at 5000 r.p.m.

for 30 s, which was then quickly casted by a 150 μL 1 mg/mL PCBM solution in toluene at 10 s of the spin-coating process. Then, it was annealed at 100° C. for 7 min before depositing of the ETLs. Finally, 20 nm $C_{60}$, 8 nm BCP and 80 nm copper electrodes were sequentially thermally evaporated onto the perovskite films.

For the $Cs_{0.2}FA_{0.8}PbI_{1.8}Br_{1.2}$ and $Cs_{0.05}MA_{0.45}FA_{0.5}Pb_{0.5}Sn_{0.5}I_3$ perovskite tandem solar cells with different interconnection layers, WBG sub-cells were prepared by depositing $Cs_{0.2}FA_{0.8}PbI_{1.8}Br_{1.2}$ films on PTAA substrates via the above mentioned anti-solvent method. The single layer $SnO_{2-x}$ interconnection layers were fabricated by directly depositing a 9 nm $SnO_{2-x}$ layer onto the WBG perovskite film by ALD; Choline chloride/$SnO_{2-x}$ interconnection layers were fabricated by spin-coating 10 mg/mL choline chloride solution in IPA, which were then annealed at 100° C. for 10 min before deposition of the ALD $SnO_{2-x}$; the $C_{60}/SnO_{2-x}$ interconnection layers were assembled by thermally evaporated $C_{60}$ with different thicknesses (from 10 to 60 nm) before the ALD $SnO_{2-x}$. Then, the NBG $Cs_{0.05}MA_{0.45}FA_{0.5}Pb_{0.5}Sn_{0.5}I_3$ precursor solution was rapidly spin-coated onto the different interconnection layers at 5000 r.p.m. for 30 s, which was then quickly casted by 150 μL 1 mg/mL PCBM solution in toluene at 10 s of the spin-coating process. It was then annealed at 100° C. for 7 min. Finally, 20 nm $C_{60}$, 8 nm BCP, and 80 nm copper electrodes were thermally evaporated onto the NBG perovskite films to complete the perovskite-perovskite tandem solar cells.

For the $(FA_{0.83}MA_{0.17})_{0.95}Cs_{0.05}Pb(I_{0.6}Br_{0.4})_3$ and $MA_{0.45}FA_{0.5}Cs_{0.05}Pb_{0.5}Sn_{0.5}I_3$ perovskite tandem solar cells with different interconnection layers, PTAA (2 mg/mL) dissolved in toluene was spin-coated at the speed of 5000 r.p.m. for 30 s and annealed at 100° C. for 10 min. The PTAA-coated ITO substrate was pre-wetted by spinning 30 μL DMF at 4000 r.p.m. for 10 s. Then, 100 μL $(FA_{0.83}MA_{0.17})_{0.95}Cs_{0.05}Pb(I_{0.6}Br_{0.4})_3$ perovskite precursor was spin-coated onto PTAA at 4000 r.p.m. for 30 s, and the sample was quickly casted by 140 μL toluene at 16 s of the spin-coating process. Subsequently, the sample was annealed at 65° C. for 10 min and 100° C. for 10 min. The $n^+/n$ connect unit of $C_{60}@MAI/SnO_2$ was fabricated by thermally evaporating a 25 nm $C_{60}$ layer onto the perovskite before being treated in the MAI vapor at 100° C. for 1 hour, then depositing a 9 nm $SnO_2$ layer ALD at 100° C. under 0.2 mTorr. After the substrates were transferred into the glovebox, the $MA_{0.45}FA_{0.5}Cs_{0.05}Pb_{0.5}Sn_{0.5}I_3$ precursor solution was dropped onto the substrates and spin-coated at 5000 rpm for 30 s and 0.2 mL toluene was quickly dropped onto the spinning substrate after 10 s elapse. The resulting perovskite films were annealed at 100° C. for 5 min. Subsequently, 15 nm $C_{60}$, 5 nm Bathocuproine (BCP) and 80 nm Cu were thermally evaporated onto the perovskite through a shadow mask (2 mm*4 mm).

Device Characterization
J-V Measurements

Simulated AM 1.5 G irradiation (100 mW $cm^{-2}$) was produced by a Xenon-lamp-based solar simulator (Oriel 67005, 450 W AAA Solar Simulator) for current density-voltage (J-V) measurements. The light intensity was calibrated by a Reference Solar Cell and Meter (P/N 5110V, Newport). A Keithley 2400 Source meter was used for the J-V measurements. All J-V measurements were taken under 100 mW $cm^{-2}$ illumination at reverse scan mode with a scan rate of 0.05 V $s^{-1}$.

External Quantum Efficiency (EQE) measurements were conducted with a Newport QE measurement kit by focusing a monochromatic beam of a Bruker Vertex 80v Fourier Transform Interferometer with tungsten lamp source onto the devices. Then, the photocurrent was obtained using a Stanford Research SR570 current preamplifier. Samples were calibrated to a Newport calibrated reference silicon solar cell with a known EQE. Light bias of blue light (~470 nm) and infrared light (~940 nm) were used to measure the EQE of the NBG and WBG subcells, respectively.

UPS and XPS

Valence band maximum and work function were determined from the secondary electron cutoff of appropriate spectra measured with He—I radiation (21.2 eV) which was carried out on a commercial Kratos Axis Ultra DLD Ultraviolet Photoelectron Spectrometer. The XPS was measured by a Kratos Axis Ultra DLD X-ray Photoelectron Spectrometer with an X-ray source providing monochromatic Al—Kα source.

Hall Effect Measurements

A device of Glass/ALD $SnO_{2-x}$ (20 nm)/Au (30 nm) was fabricated for Hall effect measurements. The maximum applied magnetic field intensity was 1.35 T. Rotate speed of the magnet was controlled by the applied voltage of the motor.

Figure 3A:
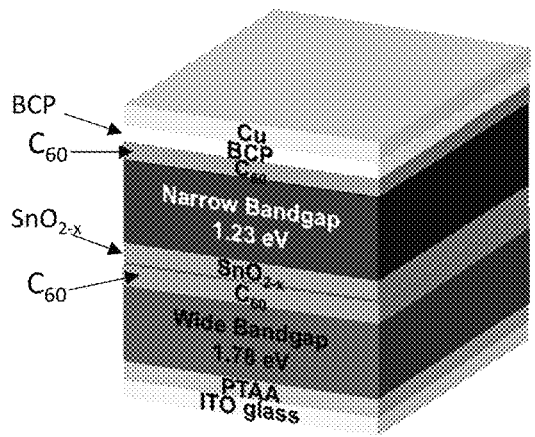
FIG. 3A shows a schematic diagram of perovskite-perovskite tandem solar cells with $C_{60}(n^+)/SnO_{2-x}(n)$ interconnection structure.
Figure 3B:
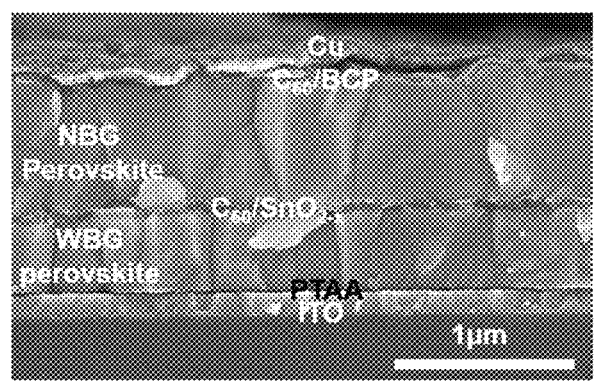
FIG. 3B shows a cross sectional SEM image of the perovskite-perovskite tandem solar cell of FIG. 3A with $C_{60}/SnO_{2-x}$ interconnection layers. The scale bar is 1 μm.

Example 1: Preliminary Characterization of Solar Cell with $C_{60}/SnO_{2-x}$ Interconnection Structure A tandem solar cell with the structure of glass/ITO/HTL/WBG OIHP/$C_{60}/SnO_{2-x}$/NBG OIHP/ETL/Cu was prepared (FIG. 3A). The WBG OIHP had a composition of $Cs_{0.2}FA_{0.8}PbI_{1.8}Br_{1.2}$ with a bandgap of 1.78 eV, and the NBG OIHP had a composition of $Cs_{0.05}MA_{0.45}FA_{0.5}Pb_{0.5}Sn_{0.5}I_3$ with a bandgap of 1.23 eV, allowing for absorption in the range of about 300 nm to about 1020 nm. The cross-sectional scanning electron microscopy (SEM) image of the device is shown in FIG. 3B. The intact multiple-layer structure indicates that the 9 nm-thick LT ALD $SnO_{2-x}$ layer grown by ALD can effectively protect the underlying WBG sub cell from the damage by the subsequent spin-coating of the NBG OIHP layer and other layers. The current density-voltage (J-V) curves of the device are provided in FIG. 3C. The device with $C_{60}$ (15 nm)/$SnO_{2-x}$ (9 nm) as the interconnection structure exhibited a $V_{OC}$ of 1.88 V, a $J_{SC}$ of 14.6 mA $cm^{-2}$, a FF of 78.4% and a PCE of 21.5% under simulated AM 1.5G illumination. The $V_{OC}$ is close to the sum of those from the two sub cells.

Figure 2A:
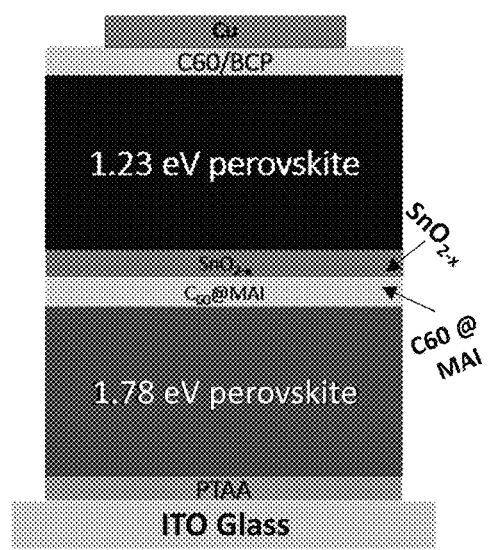
FIG. 2A shows a structure of a perovskite-perovskite tandem solar cell-based on the doped $C_{60}/SnO_{2-x}$ connect unit.
Figure 2B:
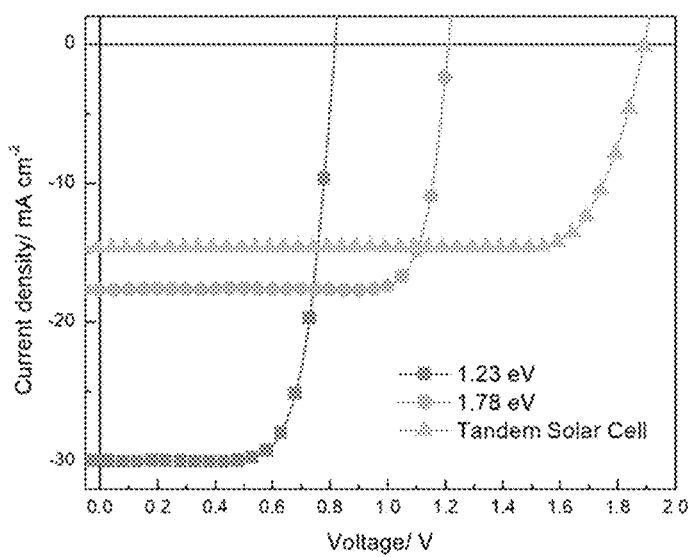
FIG. 2B shows J-V characteristics of NBG (1.23 eV) and WBG (1.78 eV) single junction perovskite solar cells and a perovskite-perovskite tandem solar cell having the doped $C_{60}/SnO_2$ connect unit.

Another tandem solar cell with the structure of glass/ITO/HTL/WBG OIHP/$C_{60}/SnO_{2-x}$/NBG OIHP/ETL/Cu was prepared, as shown in FIG. 2A. The single junction 1.78 eV solar cell (($FA_{0.83}MA_{0.17})_{0.95}Cs_{0.05}Pb(I_{0.6}Br_{0.4})_3$), exhibited an open circuit voltage ($V_{oc}$) of 1.21 V, a short circuit current density ($J_{SC}$) of 17.68 mA $cm^{-2}$, a fill factor (FF) of 0.81, and a PCE of 17.46%. The single junction 1.23 eV solar cell ($MA_{0.45}FA_{0.5}Cs_{0.05}Pb_{0.5}Sn_{0.5}I_3$), demonstrated an open circuit voltage ($V_{OC}$) of 0.82 V, a $J_{sc}$ of 29.98 mA $cm^{-2}$, a FF of 0.72 and a PCE of 17.56%. The perovskite-perovskite tandem solar cell with doped $C_{60}/SnO_{2-x}$ interconnection structure showed a $V_{OC}$ of 1.90 V, a $J_{SC}$ of 14.71 mA cm', a FF of 0.81 and a PCE of 22.64%. A comparison of the J-V of each device is provided in FIG. 2B. In this structure, the $n^+/n$ connect unit was fabricated by thermally evaporating a 25 nm $C_{60}$ layer onto the perovskite before being treated in the MAI vapor at 100° C. for 1 hour, then depositing a 9 nm SnO$_2$ layer ALD at 100° C. under 0.2 mTorr.

Example 2: Hall Effect Measurements of LT-ALD SnO$_{2-x}$

The C$_{60}$/SnO$_{2-x}$ interconnection structure can form Ohmic contact with both sub cells without forming a parasitic reverse-biased diode, which would otherwise increase the resistivity of the interconnection layers. Fullerene (C$_{60}$) can act as an ETL in perovskite solar cells and was used to form Ohmic contact with the wide bandgap sub cell. (13-16).

SnO$_{2-x}$ is broadly reported to be an n-type semiconductor (15, 17, 18). To verify the conductivity type of LT-ALD SnO$_{2-x}$, the electronic properties of SnO$_{2-x}$ were investigated using ultraviolet photoelectron spectrometry (UPS) and Hall effect measurements. LT-ALD SnO$_{2-x}$ exhibited a work function of 4.84 eV which is comparable to that of ITO. Its electron affinity and ionization energy were determined to be 4.20 eV and 7.79 eV, respectively, indicating that it is n-type, but not as heavily doped as SnO$_{2-x}$ grown at temperatures of at least 300° C. (15, 17-20). Hall effect measurements shown in FIG. 6A, FIG. 6B, FIG. 6C and Table 1 confirmed the LT-ALD SnO$_{2-x}$ was a lightly doped n-type semiconductor with a majority electron concentration of 9.0×10$^{16}$ cm$^{-3}$, an electron mobility of 4.5×10$^{-2}$ cm$^2$ V$^{-1}$ s$^{-1}$, and a conductivity of 6.5×10$^{-4}$ S cm$^{-1}$. These results agree well with those of L. Kavan et al. (21). For the films grown at 100° C., X-ray Photoelectron Spectroscopy (XPS) measurements revealed a composition of SnO$_{1.85}$.

TABLE 1

Hall effect measurement of ALD deposited SnO$_{2-x}$ thin film (20 nm).

|  | Conductivity/ S cm$^{-1}$ | Carrier concentration (N$_D$)/cm$^{-3}$ | Mobility/ cm$^2$ V$^{-1}$ s$^{-1}$ | Semiconductor type |
|---|---|---|---|---|
| ALD SnO$_{2-x}$ | 6.5 × 10$^{-4}$ | 9.0 × 10$^{16}$ | 4.5 × 10$^{-2}$ | n |

Figure 4A:
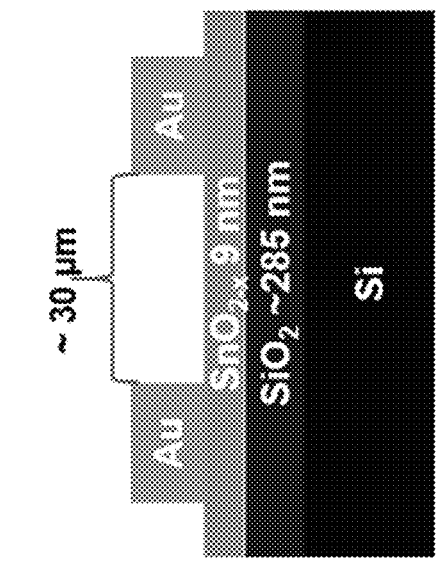
FIG. 4A shows a schematic diagram of a single-junction NBG perovskite solar cell with PEDOT:PSS and LT-ALD $SnO_{2-x}$ as HTLs.
Figure 4C:
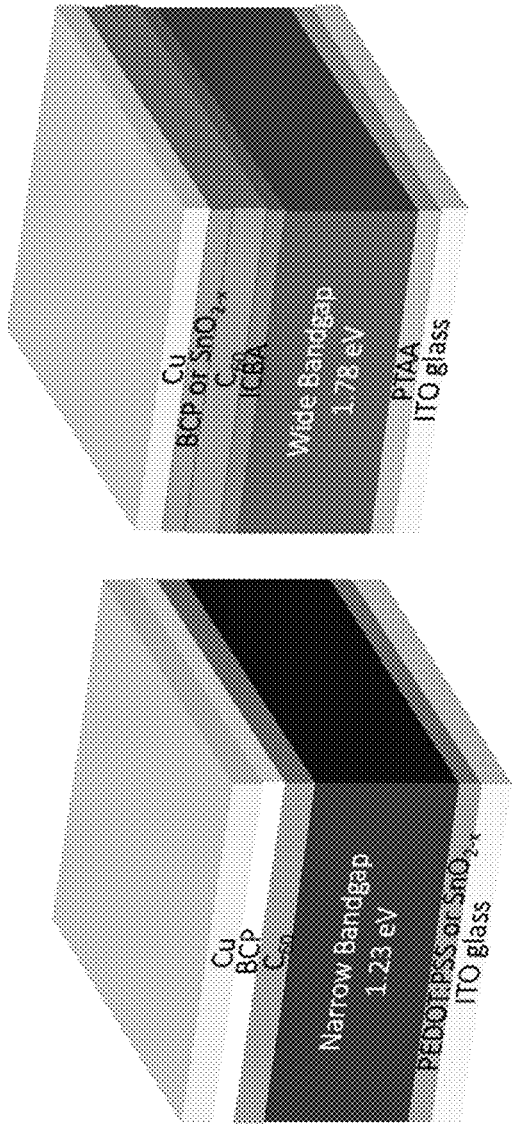
FIG. 4C shows a schematic diagram of a single-junction WBG perovskite solar cell with $C_{60}/BCP$ and $C_{60}/SnO_{2-x}$ as ETLs.
Figure 4E:
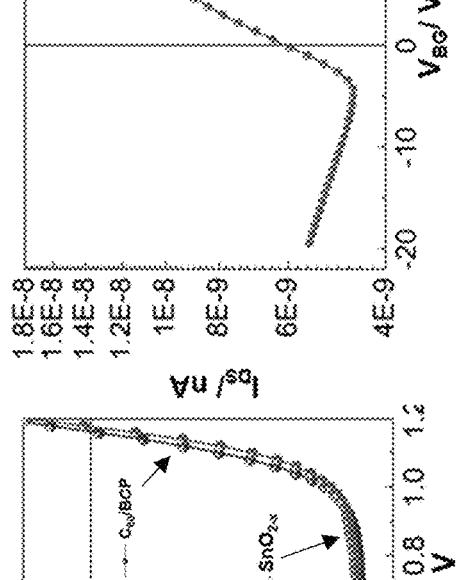
FIG. 4E shows a schematic device structure of a field-effect transistor with a 9 nm LT-ALD $SnO_{2-x}$ as the channel layer.
Figure 4B:
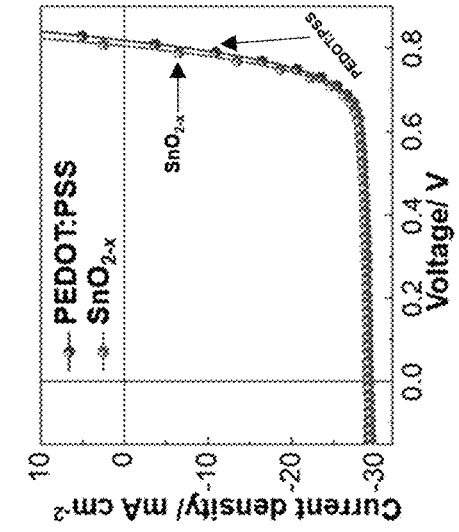
FIG. 4B shows J-V curves of a single-junction NBG perovskite solar cell with PEDOT:PSS and LT-ALD $SnO_{2-x}$ as HTLs. The J-V measurement was taken under 100 mW illumination at reverse scan mode with an active area of 0.08 cm$^2$ at a scanning rate of 0.05 V s$^{-1}$.
Figure 7A:
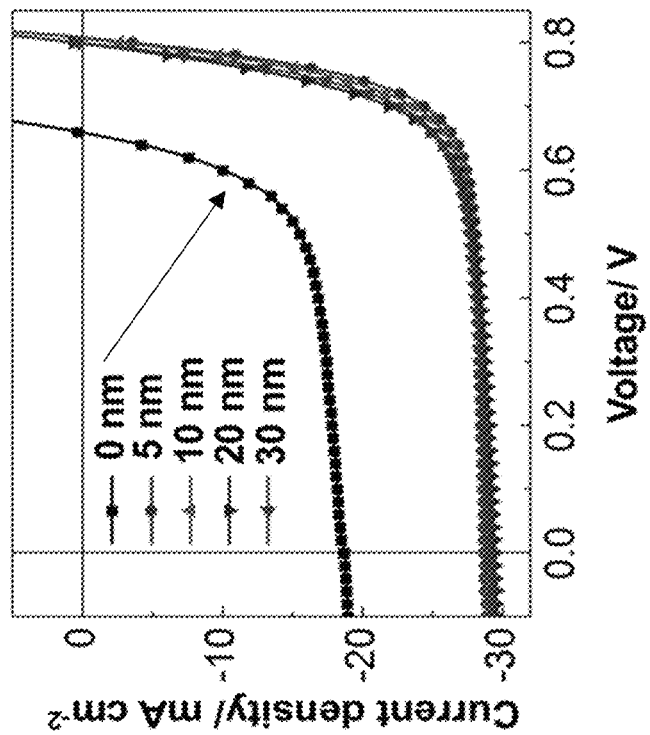
FIG. 7A shows J-V curves of single-junction NBG perovskite solar cells using hole transport layers of LT-ALD $SnO_{2-x}$ deposited under different temperatures (from 80 to 160° C.).
Figure 7B:
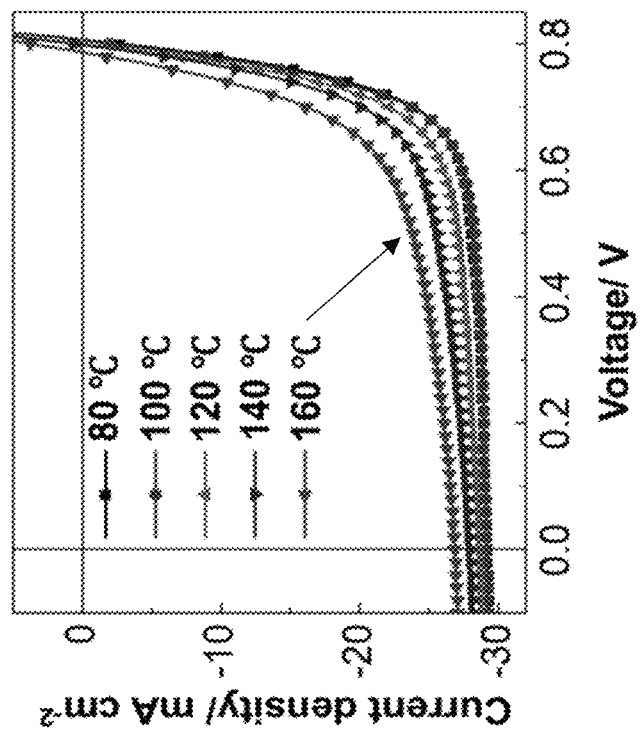
FIG. 7B shows J-V curves of single-junction NBG perovskite solar cells using hole transport layers of LT-ALD $SnO_{2-x}$ deposited with different thicknesses (from 0 to 30 nm).

Example 3: Varying the Thickness and Growth Temperature of LT-ALD SnO$_{2-x}$ Without being bound to theory, the relatively light doping of LT-ALD SnO$_{2-x}$ should enable the interconnection functionality of C$_{60}$/SnO$_{2-x}$ because LT-ALD SnO$_{2-x}$ may extract and conduct holes from the top WBG sub cell. To verify this, the single-junction NBG perovskite devices were compared with PEDOT:PSS and LT-ALD SnO$_{2-x}$ as the HTLs with the device structure shown in FIG. 4A. PEDOT:PSS has demonstrated efficacy as an HTL for NBG OIHP devices (26-29). As shown in FIG. 4B, the devices with n-type LT-ALD SnO$_{2-x}$ and PEDOT:PSS as HTLs exhibited almost the same photocurrent, confirming that LT-ALD SnO$_{2-x}$ can efficiently extract and transport holes from the NBG perovskite layers. Therefore, LT-ALD SnO$_{2-x}$ does form Ohmic contact with the NBG OIHP layer. In a series of experiments, the growth temperature and thickness of the LT-ALD SnO$_{2-x}$ layer were modified, and they were each evaluated in single-junction NBG devices. The results are provided in FIG. 7A and Table 2. The growth temperature in a range of 80-100° C. allowed for the achievement of the highest PCE in NBG perovskite solar cells. As shown in FIG. 7B and Table 3, the performance of the NBG solar cells stayed nearly constant when the thickness of the SnO$_{2-x}$ layer decreased to less than 20 nm. Following this, the performance began to decrease with further increases in the SnO$_{2-x}$ thickness. Without being bound by theory, this decrease may be induced by the limited conductivity of SnO$_{2-x}$.

TABLE 2

Photovoltaic performance of single-junction NBG devices with LT-ALD SnO$_{2-x}$ deposited under different temperatures as HTLs.

| ALD temperature/° C. | PCE/% | V$_{OC}$/V | J$_{SC}$/mA cm$^{-2}$ | FF/% |
|---|---|---|---|---|
| 80 | 17.0 | 0.80 | 29.1 | 73.1 |
| 100 | 17.2 | 0.81 | 29.2 | 72.8 |
| 120 | 16.2 | 0.80 | 28.5 | 71.1 |
| 140 | 15.0 | 0.80 | 28.0 | 66.9 |
| 160 | 13.3 | 0.79 | 26.9 | 62.6 |

TABLE 3

Photovoltaic performance of single junction NBG devices with different thickness LT-ALD SnO$_{2-x}$ as HTLs.

| Thickness (nm) | PCE/% | V$_{OC}$/V | J$_{SC}$/mA cm$^{-2}$ | FF/% |
|---|---|---|---|---|
| 0 | 7.9 | 0.66 | 18.7 | 64.0 |
| 5 | 17.4 | 0.81 | 28.7 | 74.8 |
| 10 | 17.0 | 0.81 | 28.9 | 72.6 |
| 15 | 16.5 | 0.80 | 29.4 | 70.2 |
| 20 | 16.6 | 0.80 | 29.1 | 71.3 |
| 30 | 15.4 | 0.79 | 29.0 | 67.2 |

Figure 4D:
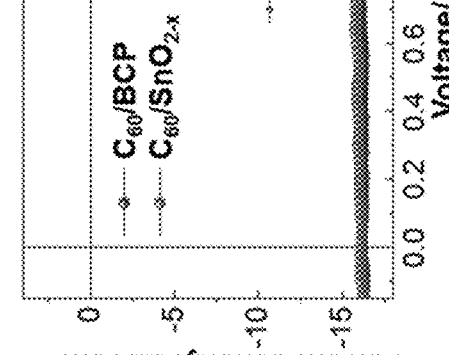
FIG. 4D shows J-V curves of single-junction WBG perovskite solar cells with $C_{60}/BCP$ and $C_{60}/SnO_{2-x}$ as ETLs. The J-V measurement was taken under 100 mW cm' illumination at reverse scan mode with an active area of 0.08 cm$^2$ at a scanning rate of 0.05 V s$^{-1}$.
Figure 4F:
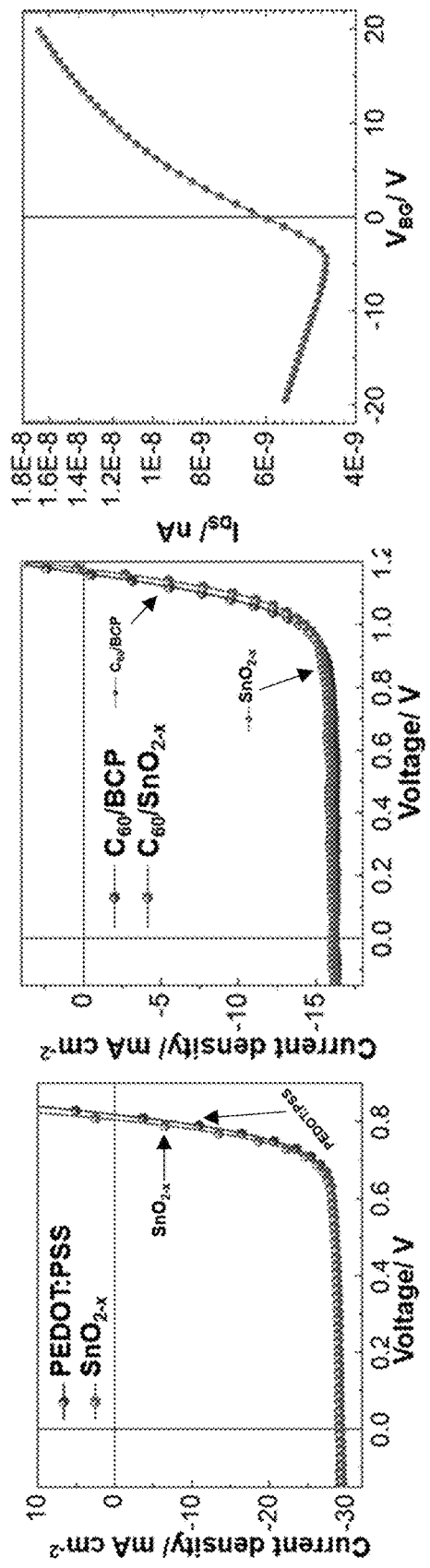
FIG. 4F shows a transfer curve of a field-effect transistor with a 9 nm LT-ALD $SnO_{2-x}$ as the channel layer.

Example 4: Demonstrating the Bipolar Transport Properties of LT-ALD SnO$_{2-x}$ As shown in the device structure of FIG. 4C, LT-ALD SnO$_{2-x}$ works well as an ETL in single junction WBG OHIP solar cells. The photocurrent curves in FIG. 4D demonstrate that inserting SnO$_{2-x}$ between the fullerene layer and the Cu electrode did not impair the device performance. The bipolar transport property of LT-ALD SnO$_{2-x}$ was further confirmed in a SnO$_{2-x}$ based thin film transistor with the device structure shown in FIG. 4E. The transfer curve in FIG. 4F shows that SnO$_{2-x}$ exhibits bipolar transport properties. Field-effect mobilities of 9.7×10$^{-2}$ cm$^2$ V$^{-1}$ s$^{-1}$ for electrons and 1.2×10$^{-2}$ cm$^2$ V$^{-1}$ s$^{-1}$ for holes were derived. Therefore, without wishing to be bound by theory, it is believed that the relatively low doping of LT-ALD SnO$_{2-x}$ enables its bipolar charge carrier transport capability, further making C$_{60}$/SnO$_{2-x}$ an efficient interconnection double layer for tandem cells. Both electrons from the WBG sub cell and holes from the NBG sub cell can flow toward the SnO$_{2-x}$ layer and recombine either inside the SnO$_{2-x}$ layer or at the C$_{60}$/SnO$_{2-x}$ interface.

Example 5: Confirming Absence of Reverse-Biased Diode Behavior

The C$_{60}$/SnO$_{2-x}$ interconnection layer should not form a reverse-biased diode, which otherwise would reduce V$_{OC}$. It can be inferred from the device structure shown in FIG. 4C that the electron current could flow from C$_{60}$ to SnO$_{2-x}$ without encountering a reverse-biased diode. In this example, the SnO$_{2-x}$ layer was inserted between C$_{60}$ and Cu or IZO electrodes, and photo-generated electrons flowed from C$_{60}$ to SnO$_{2-x}$ and then to the electrodes. If there was reverse-biased diode behavior in the C$_{60}$/SnO$_{2-x}$ structure, it would induce a large series resistance at the cathode interface. This resistance generally results in S-shaped J-V curves, which were not observed in this case. Hardly any notable energy barrier observed, evidenced by the nearly same photocurrent for the single-junction devices with and without the inserted LT-ALD $SnO_{2-x}$ layer.

Example 6: Investigations of the Doped Fullerene ($C_{60}$) Layer

Figure 3C:
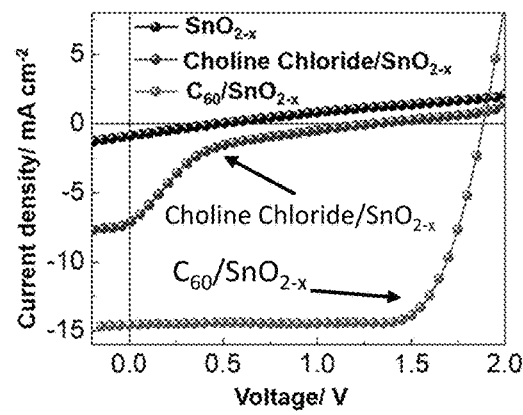
FIG. 3C shows J-V curves of tandem solar cells with different interconnection layers of $SnO_{2-x}$, Choline Chloride/$SnO_{2-x}$, or $C_{60}/SnO_{2-x}$. The measurements were taken under 100 mW cm$^{-2}$ illumination at reverse scan mode with an active area of 0.08 cm$^2$ at a scanning rate of 0.05 V s$^{-1}$. As indicated in the plot, the $SnO_{2-x}$ layer is the top curve, the middle curve is the Choline Chloride/$SnO_{2-x}$ layer, and the bottom curve is for the $C_{60}/SnO_{2-x}$ layer.
Figure 3D:
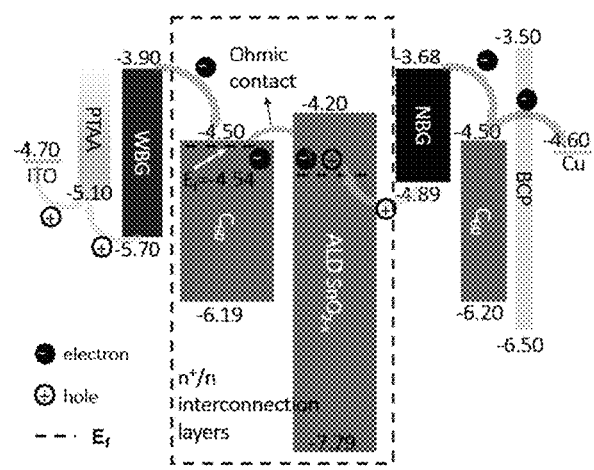
FIG. 3D shows an energy level diagram of $C_{60}/SnO_{2-x}$ based perovskite-perovskite tandem solar cells.
Figure 8:
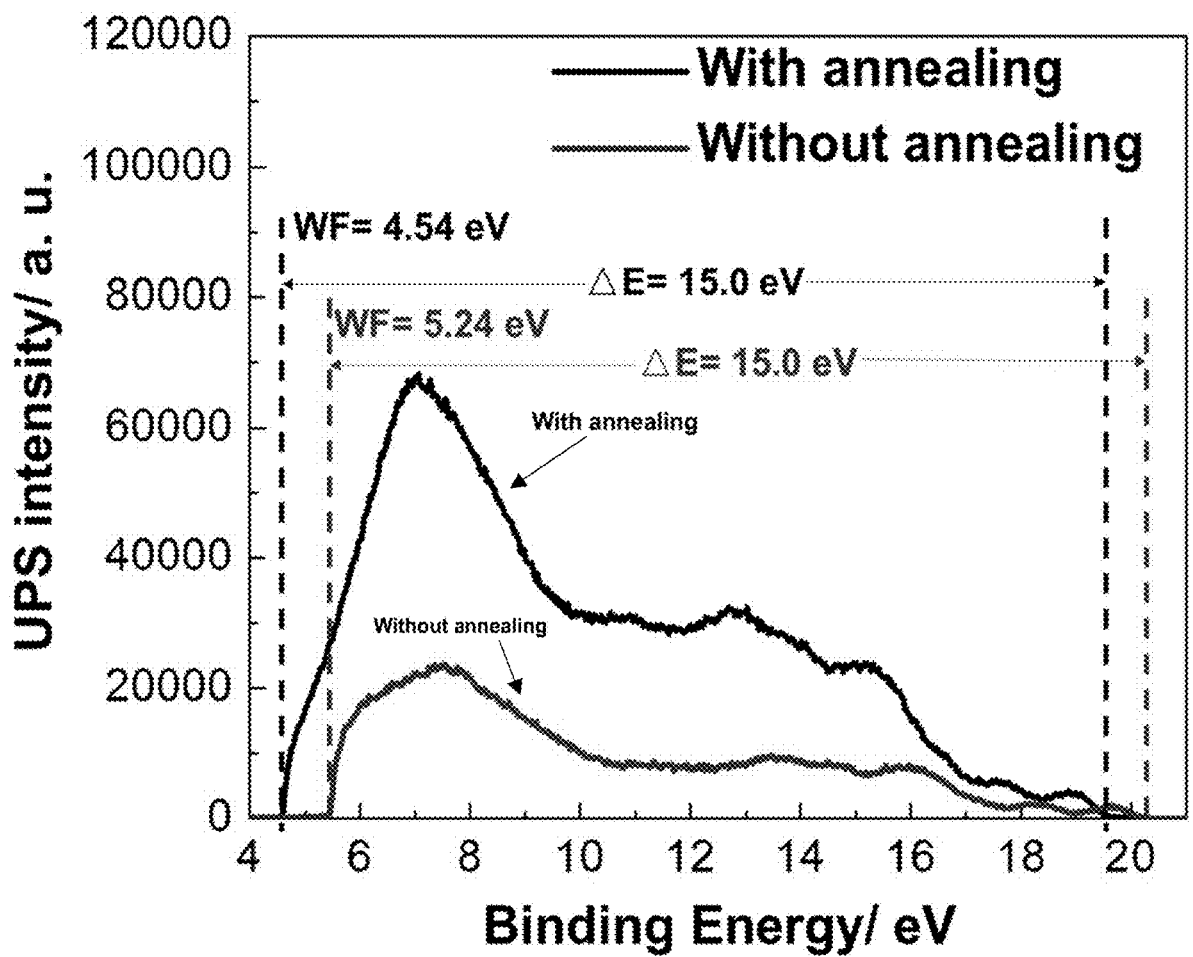
FIG. 8 shows UPS measurements for 30 nm $C_{60}$ thin films deposited on WBG perovskite with and without annealing at 100° C. for 2 hours. WF is the work function value of the samples and the ionization energy is equal to 21.2 eV−ΔF.
Figure 9:
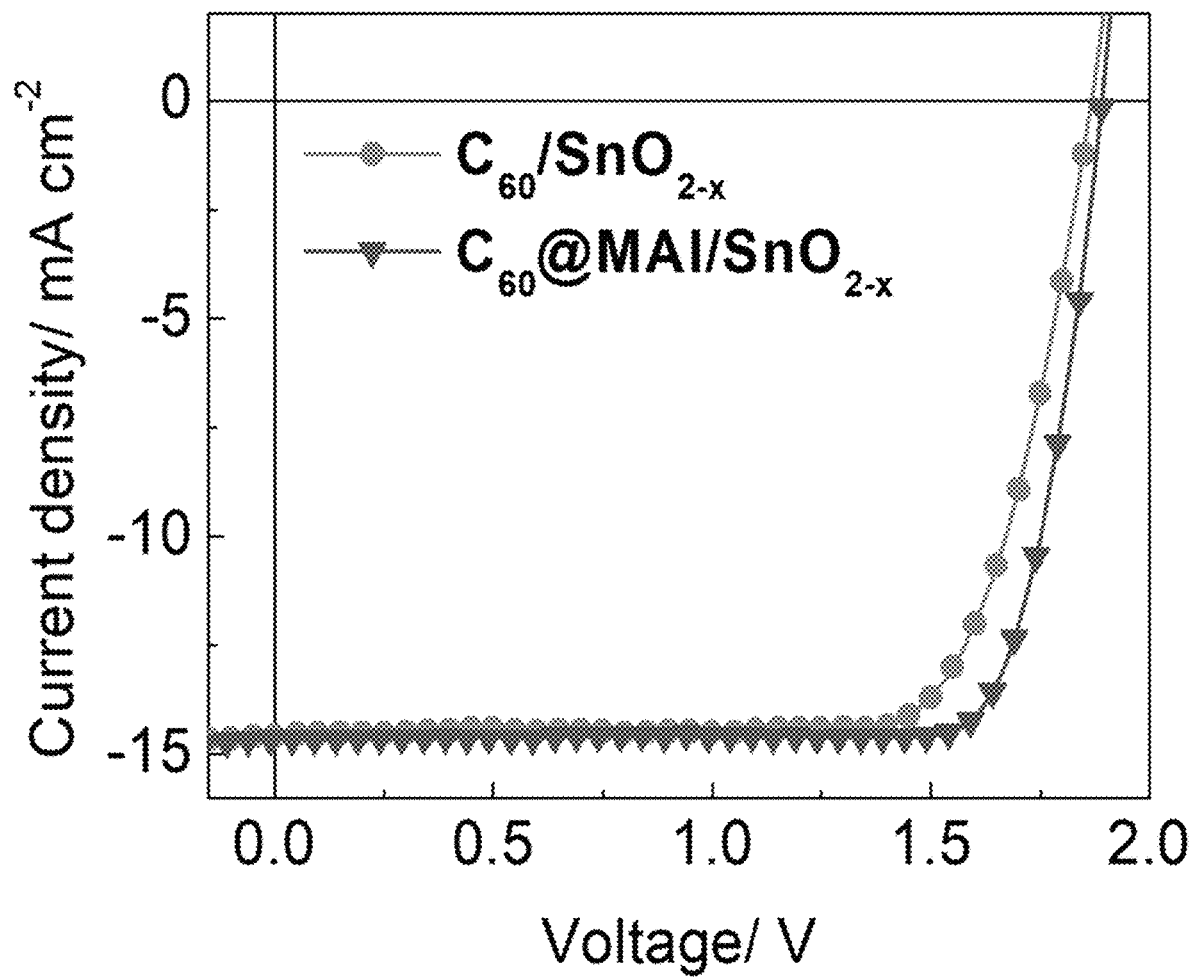
FIG. 9 shows J-V curves of perovskite-perovskite tandem solar cells based on pristine $C_{60}/SnO_{2-x}$ and doped $C_{60}$ ($C_{60}$@MAI)/$SnO_{2-x}$ interconnection layers.

When the $C_{60}$ layer was omitted from the interconnection layers, the device exhibited negligible photovoltaic effect, as shown by the J-V curve in FIG. 3C. Despite the omission of the $C_{60}$ layer, a stacking structure was still realized by solution processing due to the good protection capabilities of $SnO_{2-x}$. However, the drop in photovoltaic activity indicates that a LT-ALD $SnO_{2-x}$ layer itself does not constitute an effective interconnection layer for tandem cells, even though it conducts both electrons and holes. This was further demonstrated by replacing the $C_{60}$ layer with choline chloride. While choline chloride has been shown in the art to heal the surface defects of OIHPs, the addition of choline chloride resulted in a slightly improved but still poor photovoltaic performance with a $V_{OC}$ of 1.30 V and an S-shaped J-V curve (FIG. 3C). These results indicate that defect passivation of perovskite films is helpful in enhancing the performance of the tandem devices, but some properties of $C_{60}$ are advantageous in establishing an effective interconnection structure in the OIHP tandem cells. Without wishing to be bound by theory, it is understood that these properties lie in the doping of $C_{60}$ by iodine ions from perovskite, which assists in the formation of an Ohmic contact between $C_{60}$ and LT-ALD $SnO_{2-x}$. During the fabrication process, the devices underwent several annealing processes at a temperature of 100° C. for at least 90 minutes. The annealing drove iodine ions from the perovskite layer into the fullerene layer, thereby doping it. This was confirmed by the much smaller work function of 4.54 eV measured by UPS for the $C_{60}$ layer deposited on the perovskite after annealing, in contrast to the 5.24 eV work function for $C_{60}$ before annealing, as shown in FIG. 8. The Fermi level was very close to the lowest unoccupied molecular orbital (LUMO) of $C_{60}$ (4.50 eV), indicating that the $C_{60}$ was heavily doped. Post-annealing of the perovskite/$C_{60}$ films in MAI vapor environment was found to further increase the $V_{OC}$ and FF of the tandem devices, as shown in FIG. 9. This was attributed to the doping induced upper shifting of the Fermi level of $C_{60}$ to be higher than that of $SnO_{2-x}$, which reduced the energy barrier for electron transfer from $C_{60}$ to $SnO_{2-x}$ and thus reduced the resistivity of the interconnection layers. This is illustrated in the energy diagram shown in FIG. 2D.

Example 7: Investigations of $C_{60}$ Layer Thickness

Figure 10B:
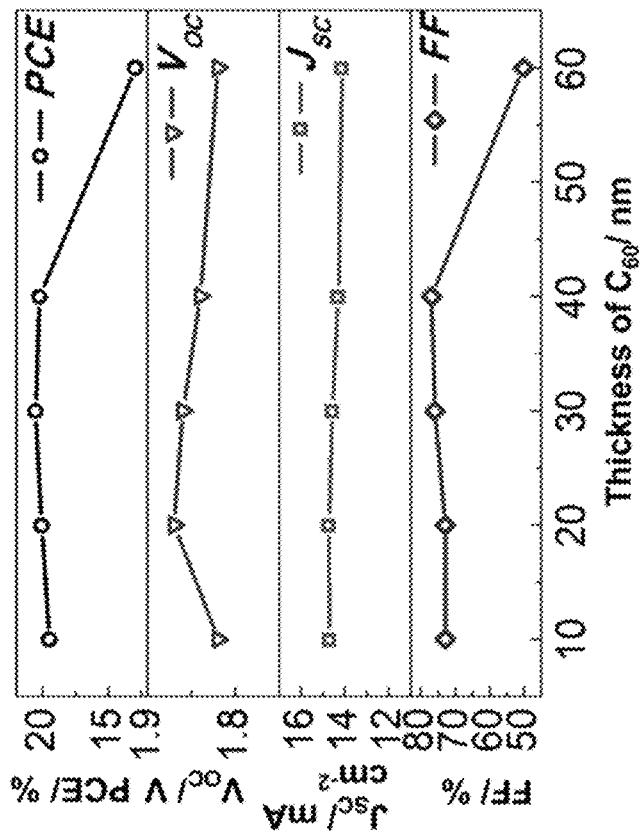
FIG. 10B shows the corresponding photovoltaic parameters of FIG. 10A of perovskite-perovskite tandem solar cells based on $C_{60}/SnO_{2-x}$ interconnection layers with different thicknesses of $C_{60}$.
Figure 10A:
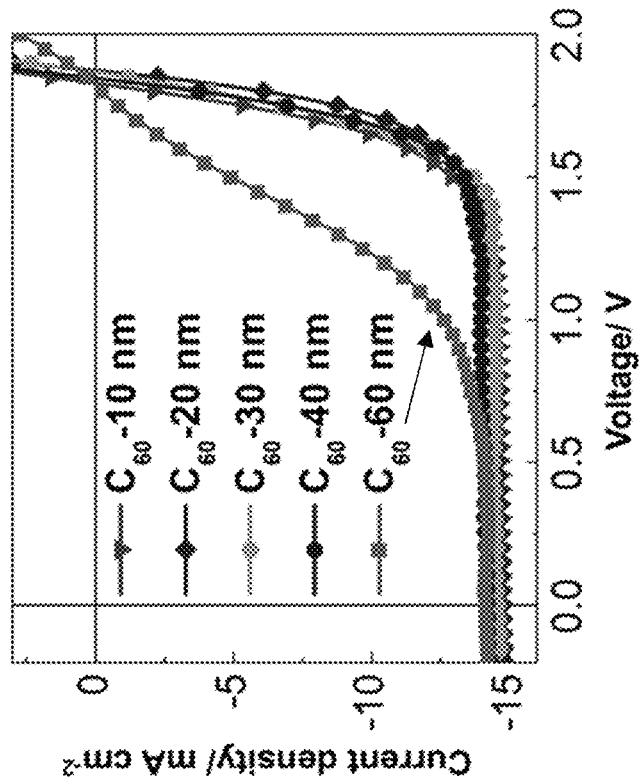
FIG. 10A shows J-V curves of perovskite-perovskite tandem solar cells based on $C_{60}/SnO_{2-x}$ interconnection layers with different thicknesses of $C_{60}$.
Figure 11:
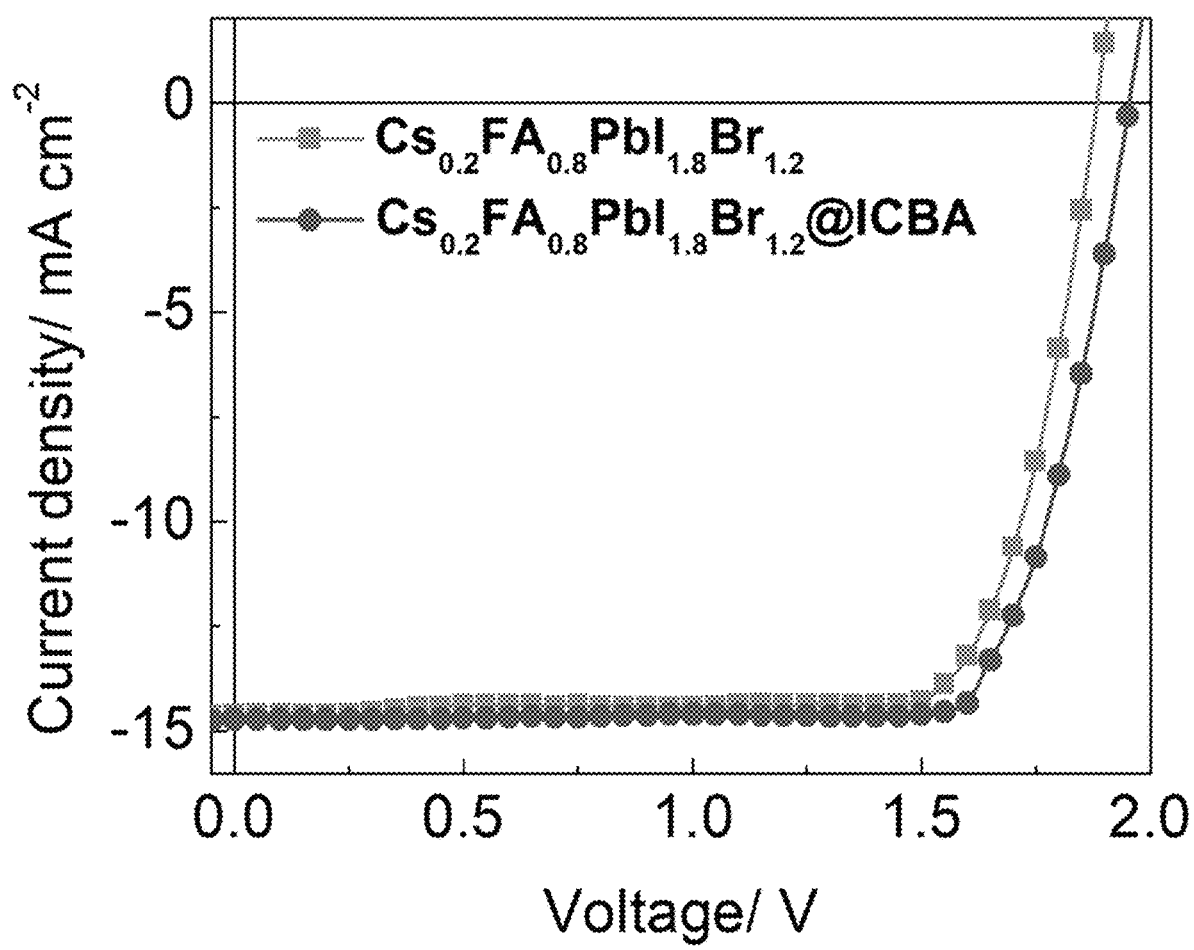
FIG. 11 shows J-V curves of perovskite-perovskite tandem solar cells with and without ICBA mixed in the WBG perovskite ($Cs_{0.2}FA_{0.8}PbI_{1.8}Br_{1.2}$) sub cells.

To enhance the perovskite-perovskite tandem device efficiency, the thickness of the $C_{60}$ layer and composition of the ETL were further investigated. While the $C_{60}$ layer requires a certain thickness to fully cover the WBG OHIP layer, a too thick $C_{60}$ film would impede the permeation of iodine ions through it. As shown in FIG. 10A, FIG. 10B, and Table 4, the $V_{OC}$ and FF of tandem devices first increased and then decreased with increasing the $C_{60}$ thickness from 10 to 60 nm. The PCE reached a peak value at a $C_{60}$ thickness of 30 nm. It was additionally discovered that adding an indene-$C_{60}$ bisadduct (ICBA) layer before $C_{60}$ deposition further increased the $V_{OC}$ of the tandem solar cells from 1.88 V to 1.95 V, as shown in FIG. 11.

TABLE 4

Photovoltaic performance of tandem device for $C_{60}$/$SnO_{2-x}$ interconnecting structure with different thicknesses of $C_{60}$ layers.

| | PCE/% | $V_{OC}$/V | $J_{SC}$/mA cm$^{-2}$ | FF/% |
|---|---|---|---|---|
| C60-10 nm | 19.5 | 1.82 | 14.7 | 72.9 |
| C60-20 nm | 20.1 | 1.87 | 14.7 | 72.9 |
| C60-30 nm | 20.6 | 1.86 | 14.6 | 75.9 |
| C60-40 nm | 20.2 | 1.84 | 14.3 | 76.9 |
| C60-60 nm | 12.9 | 1.82 | 14.1 | 50.3 |

Example 8: Power Conversion Efficiencies

FIG. 5A shows J-V curves of several of the efficient WBG, NBG and tandem cells, and the corresponding parameters of the device performance are summarized in Table 5. As shown in Table 5, one of the WBG solar cells exhibited a $V_{OC}$ of 1.22 V, a $J_{SC}$ of 15.9 mA cm', a FF of 81.2% and a PCE of 15.8%. One of the most efficient NBG single-junction solar cells had a $V_{OC}$ of 0.81 V, a $J_{SC}$ of 29.1 mA cm', a FF of 78.0% and a PCE of 18.4%. By modifying the $C_{60}$/$SnO_{2-x}$ interconnection layers and the two perovskite layers, a PCE of 22.9%, $V_{OC}$ of 1.95 V, $J_{SC}$ of 14.7 mA cm', and FF of 79.9% were achieved for perovskite-perovskite monolithic tandem solar cells. FIG. 5B shows the J-V curves of the tandem solar cell under both reverse and forward scan with a scanning rate of 0.05 V s$^{-1}$, which exhibits small hysteresis. FIG. 5C shows the steady-state photocurrent output of the tandem cell at the maximum power point (1.60 V) for 500 s, giving a stabilized PCE of 22.4%. The EQEs of the two sub cells are shown in FIG. 5D, which give an integrated $J_{SC}$ of 14.8 mA cm' for the WBG sub cell, and an integrated $J_{SC}$ of 14.9 mA cm' for the NBG sub cell. These values are well balanced and close to the $J_{SC}$ from the J-V measurement under AM 1.5G. The device efficiency distribution of the 30 tandem cells is shown in FIG. 5E, providing an average PCE of 21.4% with a standard deviation of ±0.59, indicating good reproducibility of the tandem devices. Additionally, the stability of the encapsulated tandem device stored in air and in the dark for 35 days was measured. As shown in FIG. 5F, there was no efficiency loss after over one month storage.

TABLE 5

Performance summary of the single-junction NBG and WBG perovskite devices and perovskite-perovskite tandem devices with different types of interconnection layers.

| | PCE/% | $V_{OC}$/V | $J_{SC}$/mA cm$^{-2}$ | FF/% |
|---|---|---|---|---|
| Single-junction perovskite solar cells | | | | |
| 1.23 eV | 18.4 | 0.81 | 29.1 | 78.0 |
| 1.78 eV | 15.8 | 1.22 | 15.9 | 81.2 |
| Perovskite-perovskite double-junction monolithic tandem solar cells | | | | |
| 1.78 eV/$SnO_{2-x}$/1.23 eV | 0.1 | 0.48 | 0.9 | 26.3 |
| 1.78 eV/Choline Chloride/$SnO_{2-x}$/1.23 eV | 0.9 | 1.30 | 7.1 | 10.0 |
| 1.78 eV/$C_{60}$/$SnO_{2-x}$ | 21.5 | 1.88 | 14.6 | 78.4 |
| 1.78 eV@ICBA/$C_{60}$/$SnO_{2-x}$/1.23 eV-R | 22.9 | 1.95 | 14.7 | 79.9 |
| 1.78 eV@ICBA/$C_{60}$/$SnO_{2-x}$/1.23 eV-F | 22.0 | 1.93 | 14.9 | 76.4 |

Example 9: Application of $C_{60}/SnO_{2-x}$ in Other Tandem Cells

Figure 12B:
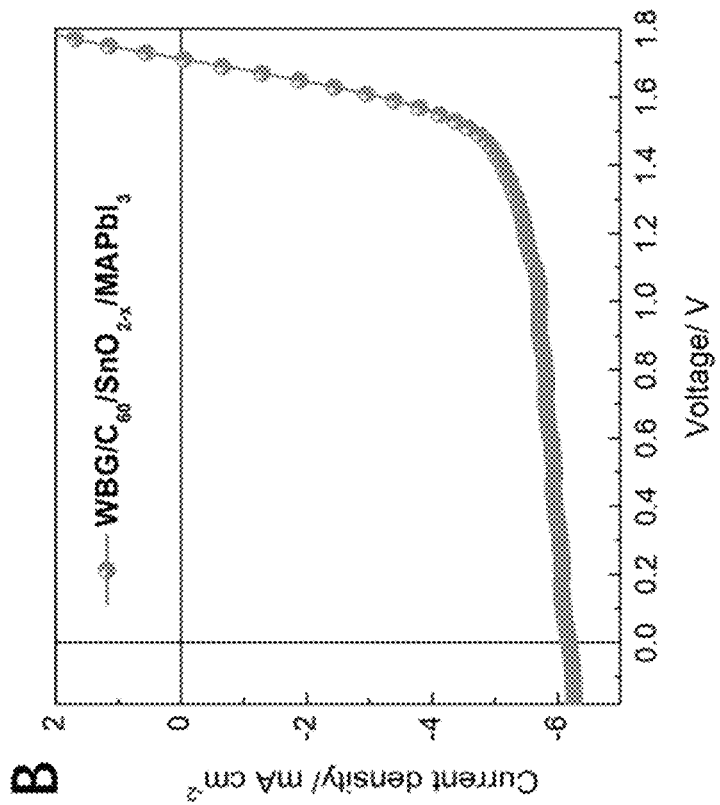
FIG. 12B show and J-V curve tandem solar cell with the structure of ITO/PTAA/WBG/$C_{60}$/$SnO_{2-x}$/MAPbI$_3$/PCBM/$C_{60}$/BCP/Cu as shown in FIG. 12A.
Figure 12A:
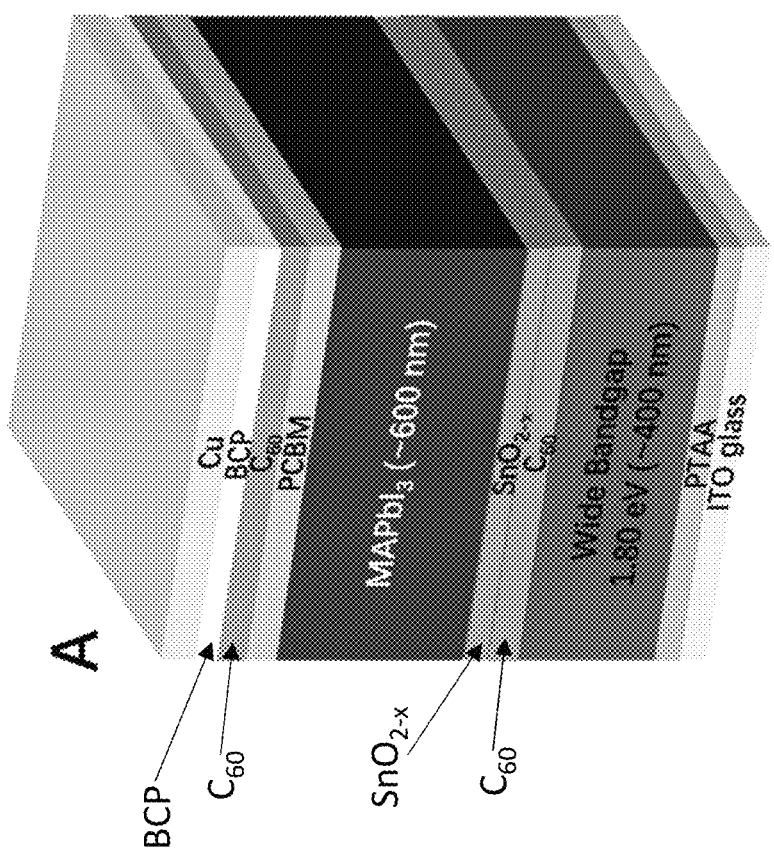
FIG. 12A shows a schematic diagram of tandem solar cell with the structure of ITO/PTAA/WBG/$C_{60}$/$SnO_{2-x}$/MAPbI$_3$/PCBM/$C_{60}$/BCP/Cu.

The $C_{60}/SnO_{2-x}$ interconnection layers also behaved as good interconnection layers in other types of perovskite-perovskite monolithic tandem cells. When the NBG layer was replaced by $MAPbI_3$, the $WBG/MAPbI_3$ tandem device outputted a $V_{OC}$ of 1.70 V before any modifications, as shown in FIG. 12A and FIG. 12B. This implies that the $n^+/n$ type interconnection structure can be applied in tandem devices using other active materials.

REFERENCES

The references listed below as well as all references cited in the specification are incorporated herein by reference to the extent that they supplement, explain, provide a background for or teach methodology, techniques and/or compositions employed herein. All cited patents and publications referred to in this application are herein expressly incorporated by reference.

A. Yakimov, S. Forrest, High photovoltage multiple-heterojunction organic solar cells incorporating interfacial metallic nanoclusters, *Appl. Phys. Lett.* 80, 1667 (2002).
2. A. Hadipour et al., Solution-Processed Organic Tandem Solar Cells, *Adv. Funct. Mater.* 16, 1897 (2006).
3. Y. Zhou, C. Fuentes-Hernandez, J. W. Shim, T. M. Khan, B. Kippelen, High performance polymeric charge recombination layer for organic tandem solar cells, *Energy Environ. Sci.* 5, 9827 (2012).
4. J. H. Heo, S. H. Im, $CH_3NH_3PbBr_3$—$CH_3NH_3PbI_3$ perovskiteperovskite tandem solar cells with exceeding 2.2 V open circuit voltage, *Adv. Mater.* 28, 5121 (2016).
5. F. Jiang et al., A two-terminal perovskite/perovskite tandem solar cell, *J. Mater. Chem. A* 4, 1208 (2016).
6. Y. Liu et al., High efficiency tandem thin-perovskite/polymer solar cells with a graded recombination layer, *ACS Appl. Mater. Interfaces* 8, 7070 (2016).
7. M. Saliba et al., Cesium-containing triple cation perovskite solar cells: improved stability, reproducibility and high efficiency, *Energy Environ. Sci.* 9, 1989 (2016).
8. G. E. Eperon et al., Perovskite-perovskite tandem photovoltaics with optimized bandgaps, *Science*, 354, 861 (2016).
9. A. Raj agopal et al., Highly Efficient Perovskite-Perovskite Tandem Solar Cells Reaching 80% of the Theoretical Limit in Photovoltage, *Adv. Mater.* 29, 1702140 (2017).
10. K. A. Bush et al., 23.6%-efficient monolithic perovskite/silicon tandem solar cells with improved stability, Nat. Energy 2, 17009 (2017).
11. Y. H. Jang, J. M. Lee, J. W. Seo, I. Kim, D.-K. Lee, Monolithic tandem solar cells comprising electrodeposited $CuInSe_2$ and perovskite solar cells with a nanoparticulate ZnO buffer layer, *J. Mater. Chem. A* 5, 19439 (2017).
12. W. S. Yang et al., Iodide management in formamidinium-lead-halidebased perovskite layers for efficient solar cells, *Science* 356, 1376 (2017).
13. Y. Shao, Z. Xiao, C. Bi, Y. Yuan, J. Huang, Origin and elimination of photocurrent hysteresis by fullerene passivation in $CH_3NH_3PbI_3$ planar heterojunction solar cells, *Nat. Commun.* 5, 5784 (2014).
14. K. Wojciechowski et al., $C_{60}$ as an efficient n-type compact layer in perovskite solar cells, *J. Phys. Chem. Lett.* 6, 2399 (2015).
15. J. Xu et al., Perovskitefullerene hybrid materials suppress hysteresis in planar diodes, *Nat. Commun.* 6, 7081 (2015).
16. H. Yoon, S. M. Kang, J.-K. Lee, M. Choi, Hysteresis-free low-temperature-processed planar perovskite solar cells with 19.1% efficiency, *Energy Environ. Sci.* 9, 2262 (2016).
17. Q. Dong et al., Insight into perovskite solar cells based on $SnO_2$ compact electron-selective layer, *J. Phys. Chem. C* 119, 10212 (2015).
18. Q. Jiang et al., Enhanced electron extraction using $SnO_2$ for high-efficiency planar-structure $HC(NH_2)_2PbI_3$-based perovskite solar cells, *Nat. Energy* 2, 16177 (2017).
19. L. Loch, The semiconducting nature of stannic oxide, *J. Electrochem. Soc.* 110, 1081 (1963).
20. E. Boyali, V. Baran, T. Asar, S. Özcelik, M. Kasap, Temperature dependent electron transport properties of degenerate SnO2 thin films, *J. Alloys Compd.* 692, 119 (2017).
21. L. Kavan, L. Steier, M. Grätzel, Ultrathin buffer layers of $SnO_2$ by atomic layer deposition: perfect blocking function and thermal stability, *J. Phys. Chem. C* 121, 342 (2016).
22. S. Samson, C. Fonstad, Defect structure and electronic donor levels in stannic oxide crystals, *J. Appl. Phys.* 44, 4618 (1973).
23. Z. Jarzebski, J. Marton, Physical properties of $SnO_2$ materials II. Electrical properties, *J. Electrochem. Soc.* 123, 299C (1976).
24. Y. Matsushima et al., Thermogravimetric investigation of oxygen deficiency in $SnO_2$ reduced at 500° C. or below, *Solid State Ionics* 308, 101 (2017).
25. G. Yang et al., Effective Carrier-Concentration Tuning of $SnO_2$ Quantum Dot Electron-Selective Layers for High-Performance Planar Perovskite Solar Cells, *Adv. Mater.*, 1706023 (2018).
26. Y. Li et al., 50% Sn-Based Planar Perovskite Solar Cell with Power Conversion Efficiency up to 13.6%, *Adv. Energy Mater.* 6, 1601353 (2016).
27. Z. Yang et al., Stable Low-Bandgap Pb Sn Binary Perovskites for Tandem Solar Cells, *Adv. Mater.* 28, 8990 (2016).
28. R. Prasanna et al., Band gap tuning via lattice contraction and octahedral tilting in perovskite materials for photovoltaics, *J. Am. Chem. Soc.* 139, 11117 (2017).
29. D. Zhao et al., Low-bandgap mixed tin-lead iodide perovskite absorbers with long carrier lifetimes for all-perovskite tandem solar cells, *Nat. Energy* 2, 17018 (2017).
30. C. Z. Li et al., Doping of Fullerenes via Anion-Induced Electron Transfer and Its Implication for Surfactant Facilitated High Performance Polymer Solar Cells, *Adv. Mater.* 25, 4425 (2013).
31. X. Sun et al., Halide anion-fullerene π noncovalent interactions: n-doping and a halide anion migration mechanism in p-i-n perovskite solar cells, *J. Mater. Chem. A*, 5, 20720 (2017).
32. Y. Bai et al., Enhancing stability and efficiency of perovskite solar cells with crosslinkable silane-functionalized and doped fullerene, *Nat. Commun.* 7, 12806 (2016).
33. Y. Lin et al., Matching Charge Extraction Contact for Wide-Bandgap Perovskite Solar Cells, *Adv. Mater.* 29, 1700607 (2017).

Efforts have been made to ensure accuracy with respect to numbers used (e.g., amounts, temperature, etc.) but some experimental errors and deviations should be accounted for.

One skilled in the art will recognize many methods and materials similar or equivalent to those described herein, which could be used in the practicing the subject matter described herein. The present disclosure is in no way limited to just the methods and materials described.

Unless defined otherwise, technical and scientific terms used herein have the same meaning as commonly understood by one of ordinary skill in the art to which this subject matter belongs, and are consistent with: Singleton et al (1994) Dictionary of Microbiology and Molecular Biology, 2nd Ed., J. Wiley & Sons, New York, N.Y.; and Janeway, C., Travers, P., Walport, M., Shlomchik (2001) Immunobiology, 5th Ed., Garland Publishing, New York.

Throughout this specification and the claims, the words "comprise," "comprises," and "comprising" are used in a non-exclusive sense, except where the context requires otherwise. It is understood that embodiments described herein include "consisting of" and/or "consisting essentially of" embodiments.

Where a range of values is provided, it is understood that each intervening value, to the tenth of the unit of the lower limit, unless the context clearly dictates otherwise, between the upper and lower limit of the range and any other stated or intervening value in that stated range, is encompassed. The upper and lower limits of these small ranges which may independently be included in the smaller rangers is also encompassed, subject to any specifically excluded limit in the stated range. Where the stated range includes one or both of the limits, ranges excluding either or both of those included limits are also included.

Many modifications and other embodiments set forth herein will come to mind to one skilled in the art to which this subject matter pertains having the benefit of the teachings presented in the foregoing descriptions and the associated drawings. Therefore, it is to be understood that the subject matter is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A double junction tandem perovskite solar cell comprising:
   a transparent conductive substrate;
   a hole transport layer disposed on said conductive substrate;
   a wide bandgap perovskite layer disposed on said hole transport layer;
   an X layer disposed on said wide bandgap perovskite layer;
   an interconnection layer disposed on said X layer, wherein said interconnection layer consists essentially of:
      an ion-doped fullerene layer; and,
      a $SnO_{2-x}$ (0<x<1) layer having a thickness of about 2 nm to about 200 nm;
      wherein x is from about 0.5 to about 0.95, and
   a Y layer disposed on said SnO2-x (0<x<1) layer of said interconnection layer;
   a narrow bandgap perovskite layer disposed on said Y layer;
   an electron transport layer disposed on said narrow bandgap perovskite layer; and
   an electrode disposed on said electron transport layer, wherein
      said Y layer does not comprise a conductive transparent oxide material;
      said X layer is absent or present, and when absent, said ion-doped fullerene layer is disposed on said wide bandgap perovskite layer; and
      said Y layer is absent or present, and when absent, said narrow bandgap perovskite layer is disposed on said metal oxide layer;
   or,
   a double junction tandem perovskite solar cell comprising:
   a transparent conductive substrate;
   an electron transport layer disposed on said conductive substrate;
   a wide bandgap perovskite layer disposed on said electron transport layer;
   a Y layer disposed on said wide bandgap perovskite layer;
   an interconnection layer disposed on said Y layer, wherein said interconnection layer consists essentially of:
      an ion-doped fullerene layer; and,
      a $SnO_{2-x}$(0<x<1) layer having a thickness of about 2 nm to about 200 nm;
      wherein x is from about 0.5 to about 0.95, and
   an X layer disposed on said $SnO_{2-x}$(0<x<1) layer of said interconnection layer;
   a narrow bandgap perovskite layer disposed on said X layer;
   a hole transport layer disposed on said narrow bandgap perovskite layer; and
   an electrode disposed on said hole transport layer, wherein
      said Y layer does not comprise a conductive transparent oxide material;
      said X layer is absent or present, and when absent, said narrow bandgap perovskite layer is disposed on said ion-doped fullerene layer; and
      said Y layer is absent or present, and when absent, said metal oxide layer is disposed on said wide bandgap perovskite layer.

2. The double junction tandem perovskite solar cell of claim 1, wherein said ion in said ion-doped fullerene layer is selected from the group consisting of iodine ($I^-$) bromine ($Br^-$), chlorine ($Cl^-$), and fluorine($F^-$); and wherein said ion-doped fullerene layer comprises a fullerene selected from the group consisting of $C_{60}$, $C_{70}$, $C_{60}$ self-assembly molecules, phenyl-$C_{61}$-butryric acid methyl ester (PCBM), and indene $C_{60}$ bis adduct (ICBA).

3. The double junction tandem perovskite solar cell of claim 2, wherein said ion is iodine (I).

4. The double junction tandem perovskite solar cell of claim 2, wherein said fullerene is $C_{60}$.

5. The double junction tandem perovskite solar cell of claim 1, wherein said ion-doped fullerene layer has a thickness of about 30 nm.

6. The double junction tandem perovskite solar cell of claim 1, wherein x in $SnO_{2-x}$(0<x<1) is about 0.15.

7. The double junction tandem perovskite solar cell of claim 6, wherein $SnO_{2-x}$(0<x<1) is an alloy comprising p-type SnO and n-type $SnO_2$, wherein said p-type SnO has a bandgap of about 0.7 eV to about 1.0 eV and said n-type $SnO_2$ has a bandgap of about 3.6 ev.

8. The double junction tandem perovskite solar cell of claim 1, wherein said wide bandgap perovskite layer has a bandgap of about 1.5 eV to about 2 eV and said narrow bandgap perovskite layer has a bandgap of about 1.0 ev to about 1.5 ev.

9. The double junction tandem perovskite solar cell of claim 8, wherein said wide bandgap perovskite layer has a bandgap of about 1.80 ev.

10. The double junction tandem perovskite solar cell of claim 8, wherein said narrow bandgap perovskite layer has a bandgap of about 1.20 eV.

11. The double junction tandem perovskite solar cell of claim 1, wherein said narrow and said wide bandgap perovskite layer are different from each other, and comprise an organic-inorganic halide perovskite of the formula $ABX_3$ wherein A comprises a cation selected from the group consisting of methylammonium (MA), tetramethylammonium, formamidinium (FA), cesium, rubidium, potassium, sodium, butylammonium, phenethylammonium, phenylammonium, guanidinium, and a combination thereof; B comprises a divalent metal selected from the group consisting of lead, tin, cadmium, germanium, zinc, nickel, platinum, palladium, mercury, titanium, silicon, and a combination thereof; and X is a halide selected from the group consisting of Cl, Br, F, I, and a combination thereof.

12. The double junction tandem perovskite solar cell of claim 1, wherein said narrow bandgap perovskite layer has a composition of $Cs_{0.05}MA_{0.45}FA_{0.5}Pb_{0.5}Sn_{0.5}I_3$ having a bandgap of about 1.23 eV and said wide bandgap perovskite layer has a composition of $Cs_{0.2}FA_{0.8}PbI_{1.8}Br_{1.2}$ having a bandgap of about 1.78 eV.

13. The double junction tandem perovskite solar cell of claim 1, wherein said electron transport layer comprises a material selected from the group consisting of $C_{60}$, $C_{70}$, $C_{60}$ self-assembly molecules, phenyl-$C_{61}$-butryric acid methyl ester (PCBM), indene $C_{60}$ bis adduct (ICBA), $TiO_2$, $SnO_2$, ZnO, bathocuproine (BCP), and a combination thereof.

14. The double junction tandem perovskite solar cell of claim 1, wherein said hole transport layer comprises a material selected from the group consisting of poly(triaryl amine) (PTAA), poly(3-hexylthiophene) (P3HT), poly(3,4-ethylenedioxythiophene) polystyrene sulfonate (PEDOT:PSS), $NiO_x$, N4,N40-bis(4-(6-((3-ethyloxetan-3y1)methoxy)hexyl)phenyl)-N4, N40-diphenyl-biphenyl-4,40-diamine (TPD), 2,2',7,7'-Tetrakis[N,N-di(4-methoxyphenyl)amino]-9,9'-spirobifluorene (spiro-OMeTAD), CuSCN, and a combination thereof.

15. The double junction tandem perovskite solar cell of claim 1, wherein said conductive substrate is selected from the group consisting of Indium Tin Oxide (ITO), Aluminum Doped Zinc Oxide (AZO), and Fluorine doped Tin Oxide (FTO).

16. The double junction tandem perovskite solar cell of claim 1, wherein said electrode is selected from the group consisting of Ag, Au, Cu, Al, Cr, Bi, graphite, and a combination thereof.

17. The double junction tandem perovskite solar cell of claim 1, wherein said X layer and said Y layer are both absent.

18. The double junction tandem perovskite solar cell of claim 1, wherein said X layer is present and comprises a material selected from the group consisting of phenyl-$C_{61}$-butryric acid methyl ester (PCBM), indene $C_{60}$ bis adduct (ICBA), $TiO_2$, $SnO_2$, ZnO, bathocuproine (BCP), and a combination thereof.

19. The double junction tandem perovskite solar cell of claim 18, wherein said Y layer is absent.

20. The double junction tandem perovskite solar cell of claim 1, wherein said Y layer is present and comprises a material selected from the group consisting of poly(triaryl amine) (PTAA), poly(3-hexylthiophene) (P3HT), poly(3,4-ethylenedioxythiophene) polystyrene sulfonate (PEDOT:PSS), $NiO_x$, N4,N40-bis(4-(6-((3-ethyloxetan-3y1)methoxy)hexyl)phenyl)-N4, N40-diphenyl-biphenyl-4,40-diamine (TPD), 2,2',7,7'-Tetrakis[N,N-di(4-methoxyphenyl)amino]-9,9'-spirobifluorene (spiro-OMeTAD), CuSCN, and a combination thereof.

21. The double junction tandem perovskite solar cell of claim 20, wherein said X layer is absent.

22. The double junction tandem perovskite solar cell of claim 1, comprising:
a transparent conductive substrate;
a hole transport layer disposed on said conductive substrate;
a wide bandgap perovskite layer disposed on said hole transport layer;
an X layer disposed on said wide bandgap perovskite layer;
an interconnection layer disposed on said X layer, wherein said interconnection layer consists essentially of:
an ion-doped fullerene layer; and,
a $SnO_{2-x}$ (0<x<1) layer having a thickness of about 2 nm to about 200 nm;
wherein x is from about 0.5 to about 0.95, and
a Y layer disposed on said $SnO_{2-x}$ (0<x<1) layer of said interconnection layer;
a narrow bandgap perovskite layer disposed on said Y layer;
an electron transport layer disposed on said narrow bandgap perovskite layer; and
an electrode disposed on said electron transport layer, wherein
said Y layer does not comprise a conductive transparent oxide material;
said X layer is absent or present, and when absent, said ion-doped fullerene layer is disposed on said wide bandgap perovskite layer; and
said Y layer is absent or present, and when absent, said narrow bandgap perovskite layer is disposed on said metal oxide layer.

23. The double junction tandem perovskite solar cell of claim 22, wherein the metal oxide layer has a thickness of about 5 nm to about 150 nm.

24. The double junction tandem perovskite solar cell of claim 1, wherein the metal oxide layer has a thickness of about 5 nm to about 150 nm.

* * * * *

UNITED STATES PATENT AND TRADEMARK OFFICE
CERTIFICATE OF CORRECTION

PATENT NO. : 12,120,893 B2  
APPLICATION NO. : 17/057460  
DATED : October 15, 2024  
INVENTOR(S) : Jinsong Huang et al.

Page 1 of 1

It is certified that error appears in the above-identified patent and that said Letters Patent is hereby corrected as shown below:

In the Claims

In Column 31, Line 61, Claim 1, delete "SnO2-x" and insert -- $SnO_{2-x}$ --, therefor.
In Column 32, Line 47, Claim 2, delete "-butryric" and insert -- -butyric --, therefor.
In Column 32, Line 48, Claim 2, delete "indene $C_{60}$ bis adduct" and insert -- indene-$C_{60}$ bisadduct --, therefor.
In Column 32, Line 50, Claim 3, delete "(I)." and insert -- (I⁻). --, therefor.
In Column 33, Line 23, Claim 12, delete "F $A_{0.5}$" and insert -- $FA_{0.5}$ --, therefor.
In Column 33, Line 30, Claim 13, delete "-butryric" and insert -- -butyric --, therefor.
In Column 33, Line 31, Claim 13, delete "indene $C_{60}$ bis adduct" and insert -- indene-$C_{60}$ bisadduct --, therefor.
In Column 33, Line 38, Claim 14, delete "$NiO_X$," and insert -- $NiO_x$, --, therefor.
In Column 33, Line 38, Claim 14, delete "-3yl)" and insert -- -3-yl) --, therefor.
In Column 34, Line 1, Claim 18, delete "butryric" and insert -- butyric --, therefor.
In Column 34, Line 1, Claim 18, delete "indene $C_{60}$ bis adduct" and insert -- indene-$C_{60}$ bisadduct --, therefor.
In Column 34, Line 11, Claim 20, delete "-3y1)" and insert -- -3-yl) --, therefor.

Signed and Sealed this
Thirteenth Day of May, 2025

Coke Morgan Stewart
*Acting Director of the United States Patent and Trademark Office*